United States Patent [19]
Blanchet-Fincher et al.

[11] Patent Number: 6,146,792
[45] Date of Patent: *Nov. 14, 2000

[54] METHOD OF MAKING A COLOR FILTER WITH HIGH SPEED AND DURABLE IMAGE-TRANSFER CHARACTERISTICS FOR LASER-INDUCED THERMAL TRANSFER

[75] Inventors: Graciela Beatriz Blanchet-Fincher; Curtis Robinson Fincher, Jr., both of Greenville, Del.

[73] Assignee: E. I. du Pont de Nemours and Company, Wilmington, Del.

[*] Notice: This patent issued on a continued prosecution application filed under 37 CFR 1.53(d), and is subject to the twenty year patent term provisions of 35 U.S.C. 154(a)(2).

[21] Appl. No.: 09/229,261

[22] Filed: Jan. 13, 1999

Related U.S. Application Data

[63] Continuation-in-part of application No. 08/891,775, Jul. 14, 1997.

[51] Int. Cl.⁷ .................. G03F 9/00; G03C 3/00
[52] U.S. Cl. .............. 430/7; 430/200; 430/201; 430/253; 430/254; 430/945
[58] Field of Search .............. 430/7, 200, 201, 430/275.1, 276.1, 945, 964, 278.1, 253, 254

[56] References Cited

U.S. PATENT DOCUMENTS

| | | | |
|---|---|---|---|
| 4,105,569 | 8/1978 | Crossfield | 252/8.6 |
| 4,347,300 | 8/1982 | Shimazu et al. | 430/156 |
| 4,476,267 | 10/1984 | Barda et al. | 524/265 |
| 4,588,674 | 5/1986 | Stewart et al. | 430/273 |
| 4,963,606 | 10/1990 | Schleifstein | 524/180 |
| 4,985,503 | 1/1991 | Bronstert et al. | 525/193 |
| 4,990,580 | 2/1991 | Ishihara et al. | 526/160 |
| 5,156,938 | 10/1992 | Foley et al. | 430/200 |
| 5,162,445 | 11/1992 | Powers et al. | 525/333.4 |
| 5,171,650 | 12/1992 | Ellis et al. | 430/20 |
| 5,212,232 | 5/1993 | Karamoto et al. | 524/779 |
| 5,238,990 | 8/1993 | Ya et al. | 524/504 |
| 5,256,506 | 10/1993 | Ellis et al. | 430/20 |
| 5,262,275 | 11/1993 | Fan | 430/273 |
| 5,308,737 | 5/1994 | Bills et al. | 430/201 |
| 5,378,385 | 1/1995 | Thomas et al. | 252/68 |
| 5,506,086 | 4/1996 | Van Zoeren | 430/201 |
| 5,521,035 | 5/1996 | Wolk et al. | 430/20 |
| 5,523,192 | 6/1996 | Blanchet-Fincher | 430/200 |
| 5,563,019 | 10/1996 | Blanchet-Fincher | 430/200 |
| 5,607,814 | 3/1997 | Fan et al. | 430/258 |
| 5,614,465 | 3/1997 | Long et al. | 503/227 |
| 5,633,113 | 5/1997 | Ellis | 430/201 |
| 5,686,383 | 11/1997 | Long et. | 503/227 |
| 5,766,819 | 6/1998 | Blanchet-Fincher | 430/201 |

FOREIGN PATENT DOCUMENTS

| | | |
|---|---|---|
| 113 167 | 7/1984 | European Pat. Off. . |
| 0 602 893 B1 | 6/1994 | European Pat. Off. . |
| 649 757 | 4/1995 | European Pat. Off. . |
| 689 939 | 1/1996 | European Pat. Off. . |
| 689 940 | 1/1996 | European Pat. Off. . |
| 8-267944 | 10/1996 | Japan . |
| 11-167019 | 6/1999 | Japan . |
| WO 90/12342 | 10/1990 | WIPO . |

*Primary Examiner*—Christopher G. Young

[57] ABSTRACT

Improved processes for laser thermal imaging and imaged laserable assemblages obtained using the improved processes of this invention are described. These improved processes operate effectively at high speeds and also afford high image densities and good durability of images present on receiver elements upon thermal imaging done in accordance with these improved processes. One application of the improved process provides a color filter element.

17 Claims, 5 Drawing Sheets

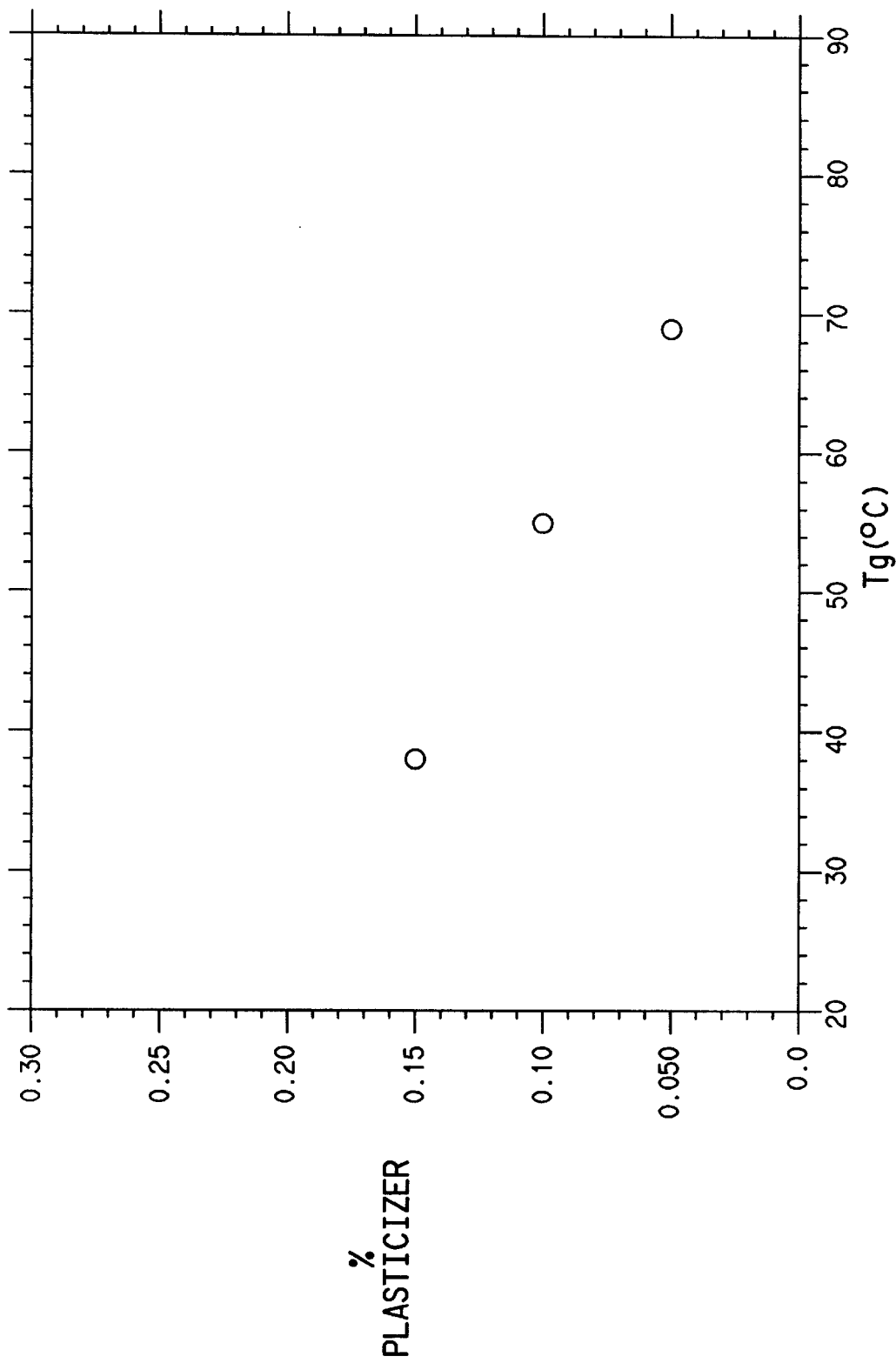

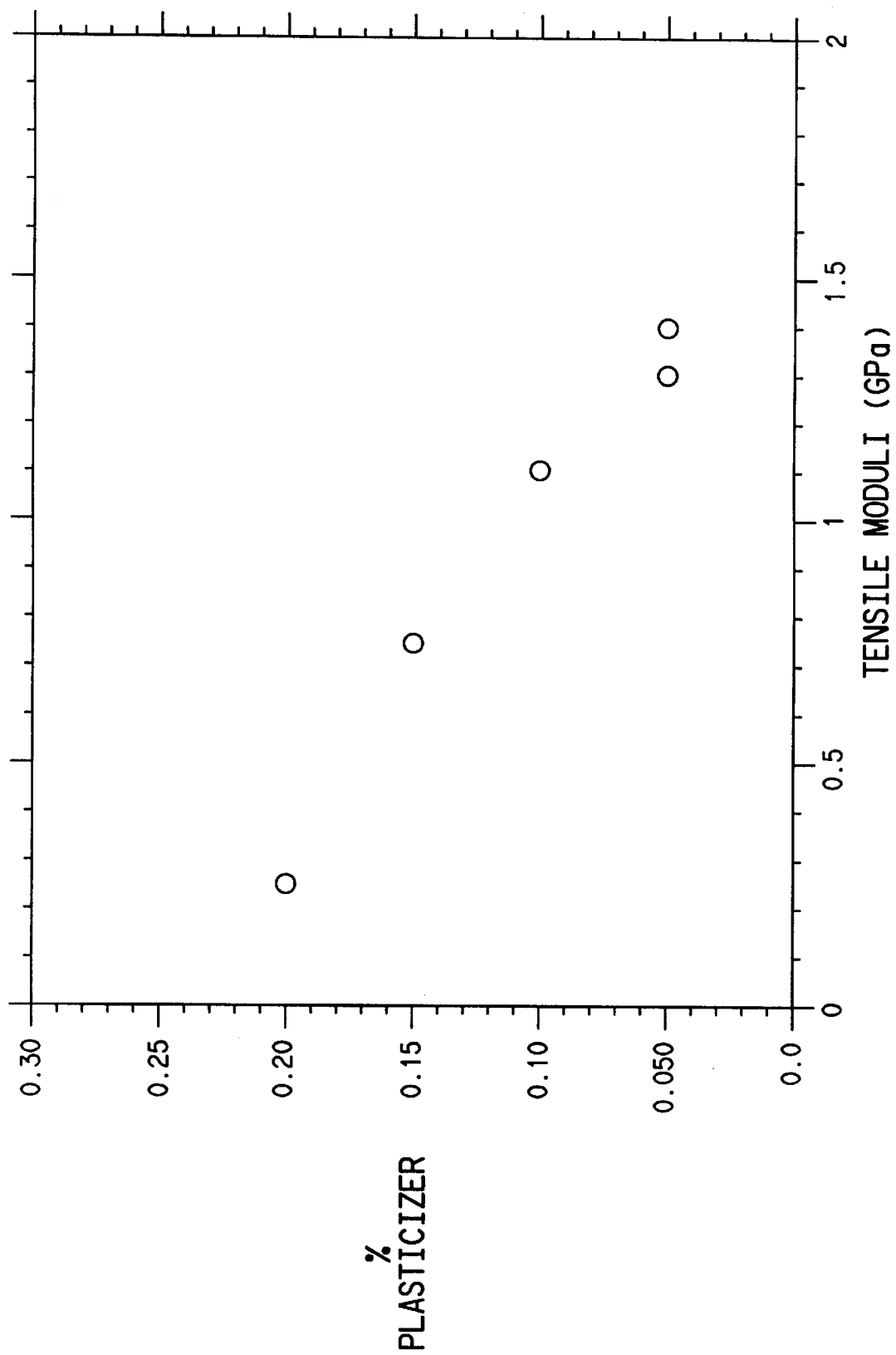

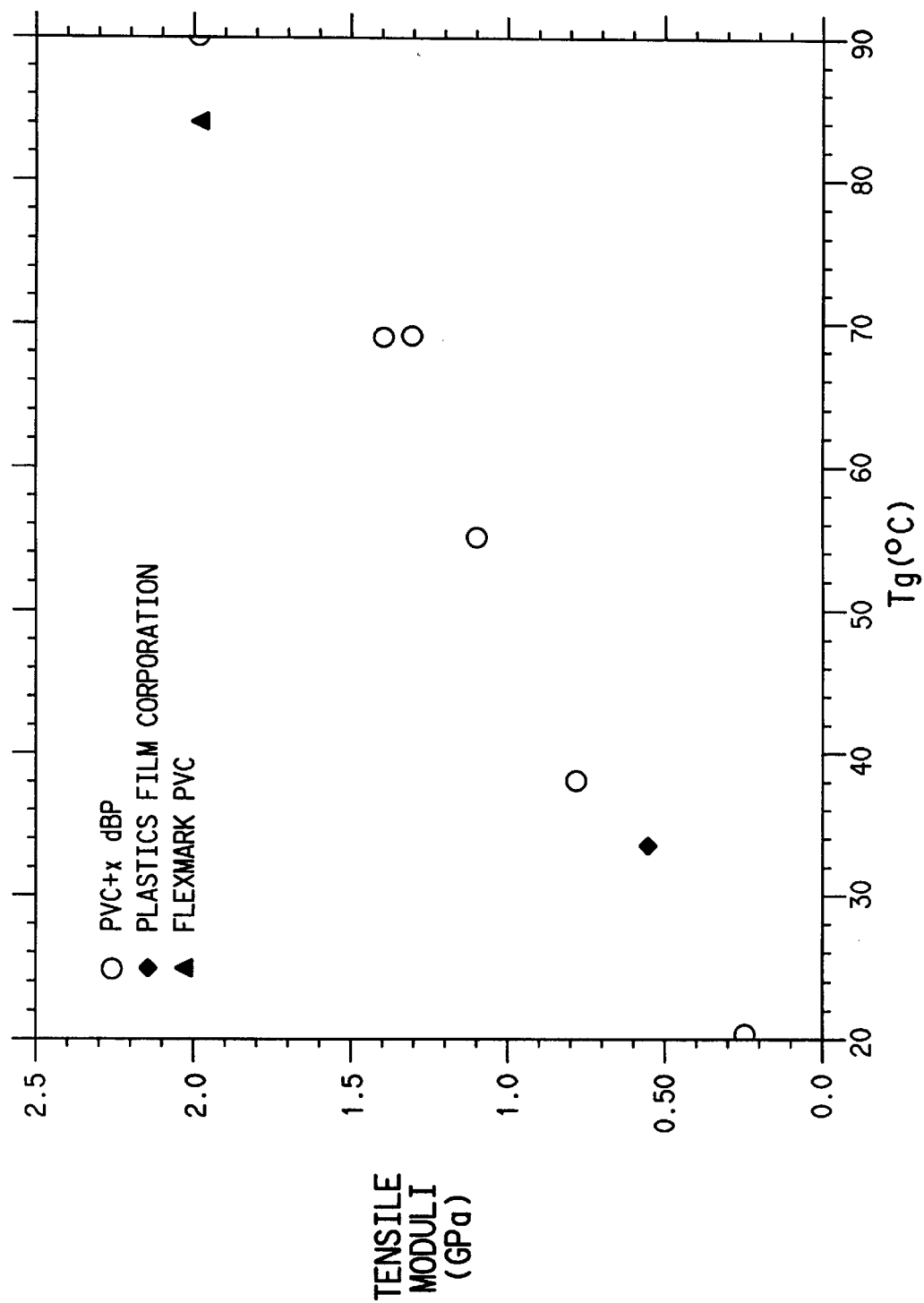

METHOD OF MAKING A COLOR FILTER WITH HIGH SPEED AND DURABLE IMAGE-TRANSFER CHARACTERISTICS FOR LASER-INDUCED THERMAL TRANSFER

RELATED APPLICATIONS

This is a continuation-in-part of U.S. application Ser. No. 08/891,775 filed Jul. 14, 1997.

FIELD OF THE INVENTION

This invention relates to improved processes for effecting laser-induced thermal transfer imaging. More particularly, it relates to improved processes which operate effectively at high speeds and which afford high image densities and good durability of images present on receiver elements upon thermal imaging.

BACKGROUND OF THE INVENTION

Laser-induced thermal transfer processes are well-known in applications such as color proofing and lithography. Such laser-induced processes include, for example, dye sublimation, dye transfer, melt transfer, and ablative material transfer. These processes have been described in, for example, Baldock, U.K. Patent 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced processes use a laserable assemblage comprising (a) a donor element that contains the imageable component, i.e., the material to be transferred, and (b) a receiver element that are in contact. The laserable assemblage is imagewise exposed by a laser, usually an infrared laser, resulting in transfer of material from the donor element to the receiver element. The (imagewise) exposure takes place only in a small, selected region of the laserable assemblage at one time, so that transfer of material from the donor element to the receiver element can be built up one pixel at a time. Computer control produces transfer with high resolution and at high speed. The laserable assemblage, upon imagewise exposure to a laser as described supra, is henceforth termed an imaged laserable assemblage.

For the preparation of images for proofing applications and in photomask fabrication, the imageable component is a colorant. For the preparation of lithographic printing plates, the imageable component is an olephilic material which will receive and transfer ink in printing.

Laser-induced processes are fast and result in transfer of material with high resolution. However, in many cases, the resulting transferred material does not have the required durability of the transferred image. In dye sublimation processes, light-fastness is frequently lacking. In ablative and melt transfer processes, poor adhesion and/or durability can be a problem. In U.S. Pat. No. 5,563,019 and U.S. Pat. No. 5,523,192, improved multilayer thermal imaging elements and associated processes are disclosed that do afford improved adhesion and/or durability of the transferred images. However, there is a continuing need for still further improved thermal imaging assemblages and associated processes having improved image transfer efficiency and higher sensitivity of the assemblages.

Photosensitive elements which can be used to make relief images are well known. The photosensitive compositions generally comprise a photoinitiator and a component which is capable of reacting with the initiator, after it has been activated by exposure to actinic radiation. The reaction of the initiator and the second component produces a change in the physical properties of the layer such that the exposed areas can be differentiated from the nonexposed areas.

Imagewise exposure of a photosensitive element as currently known to the art generally requires the use of a phototool which is a mask (photomask) having clear and opaque areas covering the photosensitive layer (e.g., photoimageable and/or photopolymerizable layer). The phototool prevents exposure and photoreaction in the non-image areas, so that the image can be later developed. The phototool is clear, i.e., transparent to actinic radiation, in the image areas so that those areas are exposed to radiation. The phototool is usually a photographic negative (or positive) of the desired printing image. If corrections are needed in the final image a new negative (or positive) should be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the practice of multiple use of a phototool and having to accurately align a phototool prior to imagewise exposure to avoid registration problems by digitally recording a phototool on a photosensitive element.

Additionally, liquid crystal display (LCD) devices have become increasingly important in displays which require very low consumption of electrical power or where the environment dictates a lightweight, planar, flat surface. For example, LCDs are used in display devices such as wristwatches, pocket and personal computers, aircraft cockpit displays, etc. However, there is a need to incorporate a color display capability into such monochrome display devices. A color filter array element typically includes the additive primary colors red, green, and blue in a black mosaic pattern. For the device to have color capability, each pixel should be aligned with a color area, e.g., red, green, or blue, of a color filter array. Depending upon the image to be displayed, one or more of the pixel electrodes is energized during display operation to allow full light, no light, or partial light to be transmitted through the color filter area associated with that pixel. The image perceived by a user is a blending of colors formed by the transmission of light through adjacent color filter areas.

A major contributor of the cost of LCDs is the color filter. The cost of producing color filters for LCDs has been very difficult to reduce because of a muliplicity of factors such as process complexity, color purity, temperature stability, and pattern fidelity. Four alternative manufacturing methods are considered to be useful for color filter production, dye gelatin, pigmented photoresist, electrodeposition and printing. Although dyes offer high transmittance and color purity they suffer from light and heat stability problems. In electrodeposition, the shape of the electrodes used for electrodeposition restricts arrangement of pixels. The printing method has also significant alignment and shape problems. The latter two methods do not allow forming fine dot patterns and, therefore, are not used in high information displays. The use of pigmented photoresist is generally the preferred method for producing color filters since both technically and economically it is the most feasible method for high quality and performance color filters. The overall size and resolution allows for the use of conventional photolithographic materials for the photoresist application. However, the problem associated with the preferred pigmented photoresist method is that the materials require numerous (~20 to 30 sequential) steps and wet chemistry to produce the color filter.

Thus, there is a need to greatly simplify the production of color filter arrays to reduce cost in order to meet the growing demand for color filter capability in LCDs.

SUMMARY OF THE INVENTION

Improved processes for effecting laser induced thermal imaging and imaged laserable assemblages made in accordance with the improved processes are disclosed herein. These improved processes are characterized by having higher sensitivities in relation to comparative (prior art) processes. Furthermore, these improved processes in affording images on receiver elements upon laser imaging are also characterized in being more durable, having higher optical densities, and exhibiting less change measured in the optical density as the exposure time is varied in relation to comparative (prior art) processes.

In a first embodiment, this invention is a laser-induced, thermal transfer process which comprises:
(1) imagewise exposing to laser radiation a laserable assemblage comprising:
    (A) a donor element comprising in the order listed:
        (a) at least one flexible ejection layer comprising a first polymer;
        (b) at least one heating layer; and
        (c) at least one transfer layer having an outer surface and comprising (i) a second polymer having a decomposition temperature T<350° C. and (ii) an imageable component;
            with the proviso that the donor element during the transfer process does not include a support ; and
    (B) a receiver element in contact with the outer surface of the transfer layer (c) of the donor element,
        wherein the imagewise exposing to laser radiation is effected at a laser fluence of less than or equal to approximately 440 mJ/cm$^2$, in which a substantial portion of the transfer layer is transferred to the receiver element; and
(2) separating the donor element from the receiver element.

In a second embodiment, the invention is a durable imaged laserable assemblage made in accordance with the process presented above (as the first embodiment).

In a third embodiment, this invention is a laser-induced, thermal transfer process which comprises:
(1) imagewise exposing to laser radiation a laserable assemblage comprising:
    (A) a donor element comprising in the order listed:
        (a) a support;
        (b) at least one ejection layer comprising a first polymer;
        (c) at least one heating layer; and
        (d) at least one transfer layer having an outer surface and comprising (i) a second polymer having a decomposition temperature T<350° C. and (ii) an imageable component;
    (B) a receiver element in contact with the outer surface of the transfer layer (d) of the donor element,
        wherein the imagewise exposing to laser radiation is effected at a laser fluence of less than or equal to approximately 440 mJ/cm$^2$, in which a substantial portion of the transfer layer is transferred to the receiver element; and
(2) separating the donor element from the receiver element.

In a fourth embodiment, the invention is a durable imaged laserable assemblage made in accordance with the process presented above (as the third embodiment).

In a fifth embodiment, this invention is a laser-induced, thermal transfer process which comprises:
(1) imagewise exposing to laser radiation a laserable assemblage comprising:
    (A) a donor element comprising in the order listed:
        (a) a flexible bottom layer having a tensile modulus of <=2.5 Gigapascals;
        (b) at least one ejection layer comprising a first polymer;
        (c) at least one heating layer; and
        (d) at least one transfer layer having an outer surface and comprising (i) a second polymer having a decomposition temperature T<350° C. and (ii) an imageable component;
            with the proviso that the donor element during the transfer process does not include a support; and
    (B) a receiver element in contact with the outer surface of the transfer layer (d) of the donor element,
        wherein the imagewise exposing to laser radiation is effected at a laser fluence of less than or equal to approximately 440 mJ/cm$^2$, in which a substantial portion of the transfer layer is transferred to the receiver element; and
(2) separating the donor element from the receiver element.

In a sixth embodiment, the invention is a durable imaged laserable assemblage made in accordance with the process presented above (as the fifth embodiment).

In a seventh embodiment, this invention is a laser-induced, thermal transfer process which comprises:
(1) imagewise exposing to laser radiation a laserable assemblage comprising:
    (A) a photosensitive receiver element comprising in order:
        (A1) a receiver support;
        (A2) a photohardenable layer comprising a binder, at least one photohardenable component, and an initiator;
        (A3) optionally a barrier layer; and
        (A4) optionally a cover sheet;
    (B) a donor element comprising in order:
        (B1) at least one flexible ejection layer comprising a first polymer;
        (B2) at least one heating layer;
        (B3) at least one transfer layer having an outer surface and comprising (i) a second polymer having a decomposition temperature T<350° C. and (ii) an imageable component;
            wherein the outer surface of the transfer layer (B3) is adjacent to and in contact with a layer of the photosensitive receiver element selected from the photohardenable layer (A2), the optional barrier layer (A3), and the optional coversheet (A4); the imagewise exposure results in exposed areas of the transfer layer (B3) being transferred to the adjacent layer of the photosensitive receiver element; and
            wherein the imagewise exposing to laser radiation is effected at a laser fluence of less than or equal to approximately 440 mJ/cm$^2$, in which a substantial portion of the transfer layer is transferred to the receiver element; and
(2) separating the donor element from the receiver element, thereby forming a photomask on the photosensitive receiver element.

In an eighth embodiment, the invention is a durable imaged laserable assemblage made in accordance with the process presented above (as the seventh embodiment).

In a ninth embodiment, the invention is a method for making a color filter element using the laser-induced, thermal transfer process as described above.

BRIEF DESCRIPTION OF THE DRAWINGS

FIG. 6 shows a plot of binder (PVC) plus plasticizer (di butyl phthalate) versus Tg (°C.). As the percentage of plasticizer increases, the Tg decreases.

FIG. 7 shows a plot of binder (PVC) plus plasticizer (di butyl phthalate) versus Tensile Moduli (GPa). As the percentage of plasticizer increases, the tensile moduli decreases.

FIG. 8 shows the tensile moduli (GPa) and Tg's of various plasticized PVC samples.

DETAILED DESCRIPTION OF THE INVENTION

Figure 1:
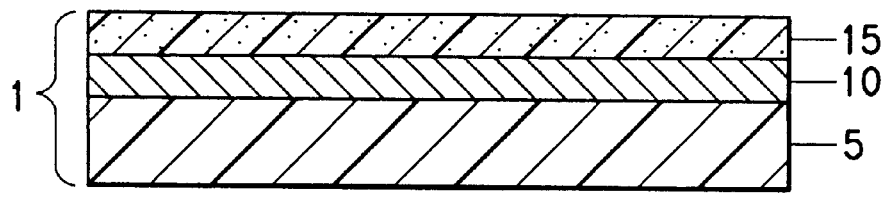
FIG. 1 illustrates a donor element (1) useful in a first embodiment of the invention having a flexible ejection layer (5), a heating layer (10), and a transfer layer (15).

Improved processes for effecting laser induced thermal transfer imaging are disclosed. Laser imaging utilizing the improved processes of this invention are effected using a laserable assemblage, which comprises (a) a donor element that contains the imageable component, i.e., the material to be transferred, and (b) a receiver element that are in contact. The laserable assemblage is imagewise exposed by a laser, usually an infrared laser, resulting in transfer of material imagewise (e.g., one pixel at a time) from the donor element to the receiver element. Upon exposure and imagewise transfer of material, the resulting laserable assemblage is termed an imaged laserable assemblage. The imaged laserable assemblage in many instances following imaging is separated into two portions—the imaged donor element and the imaged receiver element. Either the imaged donor element and/or the imaged receiver element can represent imaged products made in accordance with this invention.

Before the improved processes of this invention are described in further detail, several different exemplary laserable assemblages will be described. The processes of this invention are fast and are preferably conducted using one of these exemplary laserable assemblages to afford with high sensitivity upon laser imaging an image having higher durability characteristics and higher optical density values in comparison to those for comparative processes (prior art).

Donor Element

An exemplary donor element useful for thermal imaging in accordance with the processes of this invention comprises at least three separate and distinct layers, which are an ejection layer, a heating layer, and a transfer layer. Each of these three layers has separate and distinct functions as described, infra. In certain embodiments, a donor support can also be present.

1. Ejection Layer

The flexible ejection layer is, in the preferred embodiment, the first of the three functional layers. This layer provides the force to effect transfer of the imageable component to the receiver element. When heated, this layer decomposes into gaseous molecules providing the necessary pressure to propel or eject the imageable component onto the receiver element. This is accomplished by using a polymer having a relatively low decomposition temperature (less than about 350° C., preferably less than about 325° C., and more preferably less than about 280° C.). In the case of polymers having more than one decomposition temperature, the first decomposition temperature should be lower than 350° C. Furthermore, in order for the ejection layer to have suitably high flexibility and conformability, it should have a tensile modulus that is less than or equal to 2.5 Gigapascals (GPa), preferably less than 1.5 GPa, and more preferably less than 1 Gigapascal (GPa). The polymer chosen should also be one that is dimensionally stable. If the laserable assemblage is imaged through the donor flexible ejection layer, the flexible ejection layer should be capable of transmitting the laser radiation, and not be adversely affected by this radiation.

Examples of suitable polymers include (a) polycarbonates having low decomposition temperatures (Td), such as polypropylene carbonate; (b) substituted styrene polymers having low decomposition temperatures, such as poly(alpha-methylstyrene); (c) polyacrylate and polymethacrylate esters, such as polymethylmethacrylate and polybutylmethacrylate; (d) cellulosic materials having low decomposition temperatures (Td), such as cellulose acetate butyrate and nitrocellulose; and (e) other polymers such as polyvinyl chloride; poly(chlorovinyl chloride) polyacetals; polyvinylidene chloride; polyurethanes with low Td; polyesters; polyorthoesters; acrylonitrile and substituted acrylonitrile polymers; maleic acid resins; and copolymers of the above. Mixtures of polymers can also be used. Additional examples of polymers having low decomposition temperatures can be found in Foley et al., U.S. Pat. No. 5,156,938. These include polymers which undergo acid-catalyzed decomposition. For these polymers, it is frequently desirable to include one or more hydrogen donors with the polymer.

Preferred polymers for the ejection layer are polyacrylate and polymethacrylate esters, low Td polycarbonates, nitrocellulose, poly(vinyl chloride) (PVC), and chlorinated poly(vinyl chloride) (CPVC). Most preferred are poly(vinyl chloride) and chlorinated poly(vinyl chloride).

Other materials can be present as additives in the ejection layer as long as they do not interfere with the essential function of the layer. Examples of such additives include coating aids, flow additives, slip agents, antihalation agents, antistatic agents, surfactants, and others which are known to be used in the formulation of coatings.

One or more plasticizers can be added to a given ejection layer polymer composition in order to increase the flexibility of the polymeric composition. The increase in flexibility is indicated by changes in the magnitudes of two key physical parameters—the tensile modulus and the glass transition temperature (GTT). Both of these parameters tend to decrease in magnitude as the amount of is plasticizer is increased, which indicates increasing flexibility of the polymeric composition.

A wide variety of different plasticizers can be used in order to increase the flexibility of an ejection layer composition. Suitable plasticizers, include, but are not limited to, the following: phthalic acid derivatives, such as diphenyl phthalate and di-(2-ethylhexyl) phthalate, ricinoleic acid derivatives, such as butyl ricinoleate and propylene glycol ricinoleate, sebacic acid derivatives, such as dibutyl sebacate and dimethyl sebacate, stearic acid derivatives, such as n-butyl stearate and propylene glycol monostearate, succinic acid derivatives, such as diethyl succinate, sulfonic acid derivatives, such as N-ethyl o,p-toluene-sulfonamide, phosphoric acid derivatives, such as tricresyl phosphate and tributyl phosphate, paraffin derivatives, such as chloroparaffins containing about 40 to 70% chlorine, palmitic acid derivatives, such as isopropyl palmitate and methyl palmitate, oleic acid derivatives, such as butyl oleate and glycerol trioleate, myristic acid derivatives, such as isopropyl myristate, mellitates, such as tricapryl trimellitate and triisodecyl trimellitate, maleic acid derivatives, such as di-n-butyl maleate and di-(2-ethylhexyl) maleate, linoleic acid derivatives, such as methyl linoleate, lauric acid derivatives, such as methyl laurate, isophthalic acid derivatives, such as diphenyl isophthalate and dimethyl isophthalate, isobutyrate derivatives, such as 2,2,4-trimethyl-1,3-pentanediol, diisobutyrate, glycerol derivatives, such as glycerol triacetate, fumaric acid derivatives, such as dibutyl fumarate, epoxy derivatives, such as n-octyl epoxystearate, citric acid derivatives, such as tri-n-butyl citrate and acetyl triethyl citrate, benzoic acid derivatives, such as diethylene glycol dibenzoate and dipropylene glycol dibenzoate, azelaic acid derivatives, such as diisodecyl azelate and dimethyl azelate, and adipic acid derivatives, such as dicapryl adipate and diisodecyl adipate.

The binder polymer(s) generally makes up 100 percent by weight of the ejection layer unless plasticizer or other excipients are added. The relative weight percentage of plasticizer to binder varies depending upon the flexibility of the polymeric binder. The weight percentage of plasticizer generally ranges from 0–20 percent based upon the total weight of the ejection layer. The amount of plasticizer may be varied beyond this percentage range depending upon the particular polymeric composition and upon the desired tensile modulus and flexibility. Sufficient binder should be present at least in the proximity adjacent to the heating layer to effectively decompose and propel the transfer layer.

The donor flexible ejection layer in a three-layer system typically has a thickness of about 25 micrometers (1 mil) to about 200 micrometers (8 mils) when it is present as a single or multiple layer without an additional flexible bottom layer. The thickness of the flexible ejection layer(s) in this embodiment is important. If the thickness is less than about 25 micrometers (1 mil), the flexible ejection layer is not of sufficient strength to be properly handled readily; if the thickness is greater than about 200 micrometers (8 mils), the flexible ejection layer is likely to have reduced flexibility and conformability. A preferred thickness is about 25 micrometers (1 mil) to about 100 micrometers (4 mils). The most preferred thickness is about 50 micrometers (2 mils) to about 75 micrometers (3 mils).

Although it is preferred to have a single ejection layer, it is also possible to have more than one ejection layer or an ejection layer or layers on a flexible bottom layer, e.g., at least a four-layer system. The different ejection layers in an ejection multilayer system can have the same or different compositions, as long as they all function as described above. The total thickness of all the ejection layers and/or the ejection layer(s) and the flexible bottom layer should be in the range given above, i.e., about 25 micrometers (1 mil) to about 200 micrometers (8 mils). Several different embodiments of ejection multilayer systems of this invention are described below. The invention is exemplified by these particular embodiments but is not limited to only these embodiments. If a flexible bottom layer is utilized the ejection layer can be less than 1 mil, e.g., an ultrathin layer to 1 mil.

In one embodiment, the flexible ejection layer is a single homogeneous layer, comprising at least one polymer (binder) that is both inherently flexible (i.e., characterized in having a tensile modulus of less than or equal to 2.5 GPa and ablatable with a relatively low decomposition temperature (<about 350° C., preferably <about 325° C., and more preferably <about 280° C.) and as further defined within the specification. Preferably the tensile modulus is less than 1.5 Gigapascals and more preferably less than 1 Gigapascal. An example of a flexible ejection layer according to this invention having a single homogeneous layer without any added plasticizer(s) is a nitrated elastomer, such as nitrated poly (isoprene). This embodiment is illustrated in FIG. 1. As illustrated in FIG. 1, the donor element (1) of this embodiment comprises from bottom to top as shown in the figure an inherently flexible ejection layer (5), a heating layer (10), and a transfer layer (15). Since the ejection layer in this embodiment is inherently flexible, there is no need to add plasticizers for flexibility, but plasticizers can be added if desirable for even more flexibility or for other reasons.

In another embodiment, the flexible ejection layer is a single homogeneous layer, comprising at least one polymer (binder) that is either inherently flexible or non-flexible and further comprising at least one plasticizer that is present in sufficient amount to render the plasticized polymer binder to be sufficiently flexible as required for this invention [i.e, such that the flexible ejection layer has a tensile modulus of less than or equal to 2.5 Gigapascals (GPa), preferably less than 1.5 Gigapascals, and more preferably less than 1 Gigapascal]. Examples of flexible ejection layers according to this invention having a single homogeneous layer with added plasticizer(s) are poly(vinyl chloride) and chlorinated poly(vinyl chloride). This embodiment is also depicted by FIG. 1.

Figure 2:
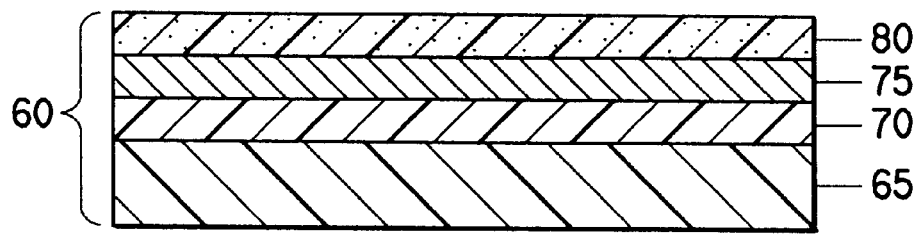
FIG. 2 illustrates a donor element (60) useful in a third embodiment of the invention having a support (65), an ejection layer (70), a heating layer (75), and a transfer layer (80).

In another embodiment, the donor element is a 4-layer structure having a support. In this embodiment, which is illustrated in FIG. 2, the donor element 60 consists of in sequence a support (65), an ejection layer (70), which may either be flexible or non-flexible, a heating layer (75), and a transfer layer (80).

Figure 3:
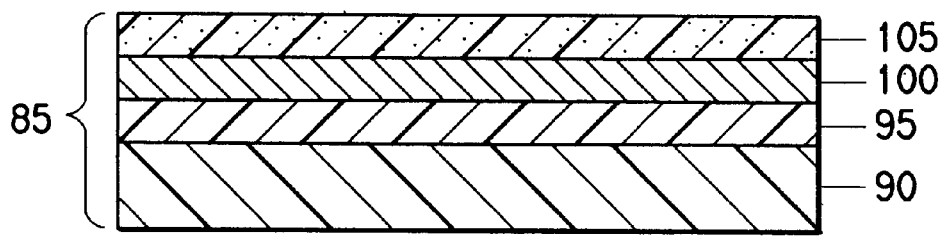
FIG. 3 illustrates a donor element (85) useful in a fifth embodiment of the invention having a flexible bottom layer (90), an ejection layer (95), a heating layer (100), and a transfer layer (105).

In another embodiment, the ejection layer is a thin polymer (binder) layer either with or without plasticizer that is contacted with a flexible bottom layer on the face of the thin polymer (binder) layer opposite to that which contacts the heating layer. The flexible bottom layer is comprised of material that is either ablative or non-ablative depending upon the thickness of the thin binder layer, i.e., for ultrathin binder layers, both the binder layer and the flexible bottom layers of this embodiment should be ablatable to provide efficient transfer. By "thin", Applicants mean less than 25 micrometers (1 mil). Typical thin layers are 0.5 to 1 micrometer. The minimum thickness in this embodiment depends upon the particular ablative characteristics of the selected decomposable binder and upon the coating methods utilized to coat the ejection layer onto the flexible bottom layer. In any case, there should be sufficient decomposable binder present in either the ejection layer or ejection layer plus flexible bottom layer to effect the ablative transfer. By "ultrathin", Applicants mean that the ejection layer is such that it totally decomposes and additional decomposing binder from the flexible bottom layer is required to achieve transfer at the standard laser pulse. Furthermore, in this embodiment, the bottom layer should be flexible to create flexible ejection layer(s). The bottom layer may comprise the same or different ablatable binder (A) with respect to the thin polymer layer or it may be an inert non-ablative flexible bottom layer, such as polyethylene. It may be any material which has flexibility and lends it to the thin polymer layer [ablatable layer (B)]. The flexible bottom layer (and the flexible ejection layers) in this embodiment has a tensile modulus of less than or equal to 2.5 Gigapascals, preferably less than 1.5 Gigapascals, and more preferably less than 1 Gigapascal. This embodiment is illustrated in FIG. 3. As illustrated in FIG. 3, the donor element (85) of this embodiment comprises from bottom to top as shown in the figure a flexible bottom layer (90), a thin ejection layer (95), a heating layer (100), and a transfer layer (105).

In another embodiment, the ejection layer comprises a thin high density ablatable binder layer on a flexible bottom layer in a layered structure wherein the high density binder layer is located between the heating layer and the flexible bottom layer. The ejection layer in this embodiment has a tensile modulus of less than or equal to 2.5 Gigapascals, preferably less than 1.5 Gigapascals, and more preferably less than 1 Gigapascal. This embodiment is also illustrated in FIG. 3. As illustrated in FIG. 3, the donor element (85) of this embodiment comprises from bottom to top as shown in the figure a flexible bottom layer (90), a thin high density ablatable ejection layer (95), a heating layer (100), and a transfer layer (105).

The ejection layer(s) can be coated onto a temporary support as a dispersion in a suitable solvent, provided that the resulting ejection layer(s) obtained upon drying are sufficiently transparent such that little or no scattering of laser light occurs. However, in most cases, it is preferred to coat the layer(s) from a solution to insure that a transparent ejection layer(s) results. Any suitable solvent can be used as a coating solvent, as long as it does not deleteriously affect the properties of the assemblage, using conventional coating techniques or printing techniques, such as those used in, for example, gravure printing. In all cases where a temporary support is used for coating the ejection layer, it is removed at some point in the manufacture of the donor element, such that the finished donor element of this invention comprises at least one ejection layer, at least one heating layer, and at least one transfer layer without there being present any inert inflexible support during the operational stage.

A thermal amplification additive is optionally present in the ejection layer(s) or the transfer layer. It can also be present in both of these layers.

The function of the additive is to amplify the effect of the heat generated in the heating layer and thus to further increase sensitivity. The additive should be stable at room temperature. The additive can be (1) a compound which, when heated, decomposes to form gaseous byproducts(s), (2) a dye which absorbs the incident laser radiation, or (3) a compound which undergoes a thermally induced unimolecular rearrangement which is exothermic. Combinations of these types of additives may also be used.

Thermal amplification additives which decompose upon heating include those which decompose to form nitrogen, such as diazo alkyls, diazonium salts, and azido (-N3) compounds; ammonium salts; oxides which decompose to form oxygen; carbonates; peroxides. Mixtures of additives can also be used. Preferred thermal amplification additives of this type are diazo compounds such as 4-diazo-N,N' diethyl-aniline fluoroborate (DAFB).

When the absorbing dye is incorporated in the ejection layer, its function is to absorb the incident radiation and convert this into heat, leading to more efficient heating. It is preferred that the dye absorb in the infrared region. For imaging applications, it is also preferred that the dye have very low absorption in the visible region. Examples of suitable infrared absorbing dyes which can be used alone or in combination include poly(substituted) phthalocyanine compounds and metal-containing phthalocyanine compounds; cyanine dyes; squarylium dyes; chalcogenopyryio-acrylidene dyes; croconium dyes; metal thiolate dyes; bis (chalcogenopyrylo) polymethine dyes; oxyindolizine dyes; bis(aminoaryl) polymethine dyes; merocyanine dyes; and quinoid dyes.

Infrared absorbing materials disclosed in U.S. Pat. Nos. 4,778,128; 4,942,141; 4,948,778; 4,950,639; 5,019,549; 4,948,776; 4,948,777 and 4,952,552 may also be suitable herein. The weight percentage of the thermal amplification additive, versus, for example, the total solid weight composition of the ejection layer may range from 0–20%. When present in the transfer coating, the thermal amplification weight percentage is generally at a level of 0.95–11.5%. The percentage can range up to 25% of the total weight percentage in the transfer coating. These percentages are non-limiting and one of ordinary skill in the art can vary them depending upon the particular composition of the ejection layer or transfer layer.

2. Heating Layer

The heating layer is deposited on the flexible ejection layer. The function of the heating layer is to absorb the laser radiation and convert the radiation into heat. Materials suitable for the layer can be inorganic or organic and can inherently absorb the laser radiation or include additional laser-radiation absorbing compounds.

Examples of suitable inorganic materials are transition metal elements and metallic elements of Groups IIIa, IVa, Va, VIa, VIII, IIIb, and Vb, their alloys with each other, and their alloys with the elements of Groups Ia and IIa. Tungsten (W) is an example of a Group VIa metal that is suitable and which can be utilized. Carbon (a Group IVb nonmetallic element) can also be used. Preferred metals include Al, Cr, Sb, Ti, Bi, Zr, TiO2, Ni, In, Zn, and their alloys; carbon is a preferred nonmetal. More preferred metals and nonmetals include Al, Ni, Cr, Zr and C. Most preferred metals are Al, Ni, Cr, and Zr.

The thickness of the heating layer is generally about 20 Angstroms to 0.1 micrometer, preferably about 50 to 100 Angstroms.

Although it is preferred to have a single heating layer, it is also possible to have more than one heating layer, and the different layers can have the same or different compositions, as long as they all function as described above. The total thickness of all the heating layers should be in the range given above, i.e., 20 Angstroms to 0.1 micrometer.

The heating layer(s) can be applied using any of the well-known techniques for providing thin metal layers, such as sputtering, chemical vapor deposition, and electron beam.

3. Transfer Layer

The transfer layer comprises (i) a polymeric binder which is different from the polymer in the ablatable portion(s) of the ejection layer, and (ii) an imageable component.

The polymer (binder) for the transfer layer is a polymeric material having a decomposition temperature that is less than or equal to 350° C. and preferably less than 300° C. The binder should be film forming and coatable from solution or from a dispersion. Binders having melting points less than about 250° C. or plasticized to such an extent that the glass transition temperature is <70° C. are preferred. However, heat-fusible binders, such as waxes should be avoided as the sole binder since such binders may not be as durable, although they are useful as cobinders in decreasing the melting point of the top layer.

It is preferred that the binder (polymer) does not self-oxidize, decompose or degrade at the temperature achieved during the laser exposure so that the imageable component and binder are transferred intact for improved durability. Examples of suitable binders include copolymers of styrene and (meth)acrylate esters, such as styrene/methylmethacrylate; copolymers of styrene and olefin monomers, such as styrene/ethylene/butylene; copolymers of styrene and acrylonitrile; fluoropolymers; copolymers of (meth)acrylate esters with ethylene and carbon monoxide; polycarbonates having higher decomposition temperatures; (meth)acrylate homopolymers and copolymers; polysulfones; polyurethanes; polyesters. The monomers for the above polymers can be substituted or unsubstituted. Mixtures of polymers can also be used.

Preferred polymers for the transfer layer (meth)acrylic polymers, including, but not limited to, acrylate homopolymers and copolymers, methacrylate homopolymers and copolymers, (meth)acrylate block copolymers, and (meth)acrylate copolymers containing other comonomer types, such as styrene.

The binder (polymer) generally has a concentration of about 15–50% by weight, based on the total weight of the transfer layer, preferably 30–40% by weight For color filter applications, the transfer can optionally include a second polymeric binder. The second binder is a high decomposition temperature binder having a decomposition temperature greater than about 395° C. The presence of the high decomposition temperature binder assures that after the color filter layer is transferred to a substrate for use in an LCD device, the color filter survives processing steps associated with formation of the LCD device. Examples of suitable binders having a decomposition temperature greater than about 395° C. include C2 to C6 polyalkylene oxides and glycols. Preferred are polyethylene oxide (PEO) (having a decomposition temperature of about 402° C.) and polyethylene glycol (PEG) (having a decomposition temperature of about 399° C.). The molecular weight (MW) of the polyethylenealkylene oxides and glycols can range from about 300 to about 100,000 and preferably is from 300 to 6800. The molecular weight is a number averaged or weight averaged molecular weight. Binders having a decomposition temperature greater than about 395° C. can be present in the transfer layer in amounts from 0 to 15% by weight, preferably 3 to 15% by weight, and most preferably at least 6% by weight, based on the total weight of the transfer layer.

The nature of the imageable component will depend on the intended application for the assemblage. For proofing, color filter array, and photomask fabrication applications, the imageable component preferably has a decomposition temperature that is greater than that of the polymeric material in the ejection layer.

For imaging applications, the imageable component will be a colorant. The colorant can be a pigment or a nonsublimable dye. It is preferred to use a pigment as the colorant for stability and for color density, and also for the high decomposition temperature. Examples of suitable inorganic pigments include carbon black and graphite. Examples of suitable organic pigments include Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral® Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751D (C.I. No. Pigment Green 7). Combinations of pigments and/or dyes can also be used. For color filter array applications, the imageable component is preferably high transparency pigments (that is at least about 80% of light transmits through the pigment), having small particle size (that is about 100 nanometers).

In accordance with principles well known to those skilled in the art, the concentration of colorant will be chosen to achieve the optical density desired in the final image. The amount of colorant will depend on the thickness of the active coating and the absorption of the colorant. Optical densities greater than 1.3 at the wavelength of maximum absorption are typically required. Even higher densities are preferred. Optical densities in the 2–3 range or higher are achievable with application of this invention.

A dispersant is usually present when a pigment is to be transferred, in order to achieve maximum color strength, transparency and gloss. The dispersant is generally an organic polymeric compound and is used to separate the fine pigment particles and avoid flocculation and agglomeration. A wide range of dispersants is commercially available. A dispersant will be selected according to the characteristics of the pigment surface and other components in the composition as practiced by those skilled in the art. However, one class of dispersant suitable for practicing the invention is that of the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in "Use of AB Block Polymers as Dispersants for Non-aqueous Coating Systems", by H. C. Jakubauskas, Journal of Coating Technology, Vol. 58, No. 736, pages 71–82. Suitable AB dispersants are also disclosed in U.K. Patent 1,339,930 and U.S. Pat. Nos. 3,684,771; 3,788,996; 4,070,388; 4,912,019; and 4,032,698. Conventional pigment dispersing techniques, such as ball milling, sand milling, etc., can be employed. For color filter applications, the binder polymer (i) of the transfer layer can also act as a dispersant for the pigment.

For lithographic applications, the imageable component is an oleophilic, ink-receptive material. The oleophilic material is usually a film-forming polymeric material and may be the same as the binder. Examples of suitable oleophilic materials include polymers and copolymers of acrylates and methacrylates; polyolefins; polyurethanes; polyesters; polyaramids; epoxy resins; novolak resins; and combinations thereof. Preferred oleophilic materials are acrylic polymers.

The imageable component can also be a resin capable of undergoing a hardening or curing reaction after transfer to the receiver element. The term "resin" as used herein encompasses (a) low molecular weight monomers or oligomers capable of undergoing polymerization reactions, (b) polymers or oligomers having pendant reactive groups which are capable of reacting with each other in crosslinking reactions, (c) polymers or oligomers having pendant reactive groups which are capable of reacting with a separate crosslinking agent, and (d) combinations thereof. The resin may or may not require the presence of a curing agent for the curing reaction to occur. Curing agents include catalysts, hardening agents, photoinitiators and thermal initiators. The curing reaction can be initiated by exposure to actinic radiation, heating, or a combination of the two.

In lithographic applications, a colorant can also be present in the transfer layer. The colorant facilitates inspection of the plate after it is made. Any of the colorants discussed above can be used. The colorant can be a heat-, light-, or acid-sensitive color former.

For photomask applications, a dye, generally a black dye and/or pigment such as carbon black or other dark material is present in the transfer layer as the imageable component. The imageable component(s) for photomask applications are chosen such that optical densities on the receiver element in areas where material has been transferred are preferably at least 2.0 and more preferably are about 3.0 or higher.

In general, for color proofing, photomask, and lithographic printing applications, the imageable component is present in an amount of from about 25 to 95% by weight, based on the total weight of the transfer coating. For color proofing applications, the amount of imageable component is preferably 35–65% by weight; for lithographic printing applications, preferably 65–85% by weight.

Although the above discussion was directed to color proofing, photomask, and lithographic printing applications, the element and process of the invention apply equally to the transfer of other types of imageable components in different applications. In general, the scope of the invention is intended to include any application in which solid material is to be applied to a receptor in a pattern. Examples of other suitable imageable components include, but are not limited to, magnetic materials, fluorescent materials, and electrically conducting materials.

Additionally, the element and process of the invention can be applied in the production of color filter elements for use in liquid crystal display (LCD) devices. In its simplest form, a liquid crystal display device consists of a liquid crystal layer with opposite sides, a set of electrodes on either side of the liquid crystal layer, and an alignment polymer layer between each set of electrodes and the liquid crystal layer. Alignment of the liquid crystal molecules occurs at a certain angle, referred to as the tilt angle, with respect to the plane of the inside of two substrates, e.g., glass plates, plastic sheets, quartz plates, or others which support the electrodes. The inside of the substrates have coatings of sets of transparent electrodes (electrical conductors), usually indium-tin oxide (ITO). The sets of electrodes are patterned compatible with the information to be displayed by the LCD. The two substrates are adhered together using appropriate spacers to preserve a constant thickness to a space or gap between substrate, and filled with various mixtures of liquid crystal materials.

Typically, color filter array element is included on the outside of one of the two substrates which support the electrodes prior to forming the LCD device. However, in forming such a liquid crystal display device the color filter array to be used therein may have to undergo rather severe heating and treatment steps during manufacture. For example, the transparent conducting layer such as ITO, is usually vacuum sputtered onto the substrate having the color filter array element which is then cured. This curing step may take place at temperatures as high as 250° C. for times which may be as long as an hour. This is followed by coating with the thin polymeric alignment layer for the liquid crystals, such as polyamide. The surface finish of the alignment layer may require rubbing or may require curing for up to several hours at elevated temperatures. Thus the color filter layer on the substrate should be able to survive the subsequent processing steps associated with the formation of the LCD device.

For color filter applications, a dye and/or pigment is present in the transfer layer as the imageable component. The imageable component(s) for color filter applications are chosen such that optical densities on the receiver element in areas where material has been transferred are preferably between 1.0 and 2.0 for red, blue and green, and between 3.0 and 4.0 for black. In general, the imageable component is present in an amount of from about 20 to 80% by weight, preferably 30 to 50% by weight, based on the total weight of the transfer coating.

Other materials can be present as additives in the transfer layer as long as they do not interfere with the essential function of the layer. Examples of such additives include coating aids, plasticizers, flow additives, slip agents, antihalation agents, antistatic agents, surfactants, and others which are known to be used in the formulation of coatings. However, it is preferred to minimize the amount of additional materials in this layer, as they may deleteriously affect the final product after transfer. Additives may add unwanted color for color proofing applications, or they may decrease durability and print life in lithographic printing applications.

The transfer layer generally has a thickness in the range of about 0.1 to 5 micrometers, preferably in the range of about 0.1 to 1.5 micrometers. Thicknesses greater than about 5 micrometers are generally not preferred as they require excessive energy in order to be effectively transferred to the receiver.

Although it is preferred to have a single transfer layer, it is also possible to have more than one transfer layer, and the different layers can have the same or different compositions, as long as they all function as described above. The total thickness of the combined transfer layers should be in the range given above.

The transfer layer(s) can be coated onto the heating layer of the donor or on a temporary support as a dispersion in a suitable solvent, however, it is preferred to coat the layer(s) from a solution. Any suitable solvent can be used as a coating solvent, as long as it does not deleteriously affect the properties of the assemblage, using conventional coating techniques or printing techniques, for example, gravure printing.

The donor element can have additional layers as well. For example, an antihalation layer can be used on the side of the flexible ejection layer opposite the transfer layer. Materials which can be used as antihalation agents are well known in the art. Other anchoring or subbing layers can be present on either side of the flexible ejection layer and are also well known in the art.

In some embodiments of this invention, a pigment, such as carbon black, is present in a single layer, termed the top layer. This type of pigment functions as both a heat absorber and a colorant, and thus the top layer has a dual function of being both a heating layer and a transfer layer. The characteristics of the top layer are the same as those given for the transfer layer. A preferred colorant/heat absorber is carbon black.

Receiver Element

The receiver element is the second part of the laserable assemblage, to which the imageable component and non-degraded polymer (polymeric binder) are transferred. In most cases, the imageable component will not be removed from the donor element in the absence of a receiver element. That is, exposure of the donor element alone to laser radiation does not cause material to be removed, or transferred into air. The material, i.e., the imageable component and binder, is removed from the donor element only when it is exposed to laser radiation and the donor element is in contact with the receiver element, i.e., the donor element actually touches the receiver element. This implies that, in such cases, complex transfer mechanisms are in operation.

The receiver element can be non-photosensitive or photosensitive. The non-photosensitive receiver element may comprise a receiver support and, optionally, an image-receiving layer. The receiver support comprises a dimensionally stable sheet material. The assemblage can be imaged through the receiver support if that support is transparent. Examples of transparent films for receiver supports include, for example polyethylene terephthalate, polyether sulfone, a polyimide, a poly(vinyl alcohol-co-acetal), polyethylene, or a cellulose ester, such as cellulose acetate. Examples of opaque support materials include, for example, polyethylene terephthalate filled with a white pigment such as titanium dioxide, ivory paper, or synthetic paper, such as Tyvek® spunbonded polyolefin. Paper supports are typical and are preferred for proofing applications, while a polyester support, such as poly(ethylene terephthalate) is typical and is preferred for a medical hardcopy and color filter array applications. For lithographic printing applications, the support is typically a thin sheet of aluminum, such as anodized aluminum, or polyester. Roughened supports may also be used in the receiver element. For color filter applications, the receiver element can also include receptor elements (i.e., permanent support) such as a glass stubstrate optionally with an image-receiving layer, and polarizing filter elements and flexible glass.

Although the imageable component can be transferred directly to the receiver support, the receiver element typically has an additional image-receiving layer on one surface thereof. For image formation applications, the image-receiving layer can be a coating of, for example, a polycarbonate; a polyurethane; a polyester; polyvinyl chloride; styrene/acrylonitrile copolymer; poly(capro-lactone); vinylacetate copolymers with ethylene and/or vinyl chloride; (meth)acrylate homopolymers (such as butyl-methacrylate) and copolymers; and mixtures thereof. This image-receiving layer can be present in any amount effective for the intended purpose. In general, good results have been obtained at coating weights of 1 to 5 g/m². For lithographic applications, typically the aluminum sheet is treated to form a layer of anodized aluminum on the surface as a receptor layer. Such treatments are well known in the lithographic art.

In addition to the image-receiving layer, the receiver element can optionally include one or more other layers between the receiver support and the image receiving layer. The additional layer or layers are particularly desirable when the receiver element is an intermediate element for use in making a color filter array as will be explained below. An additional layer between the image-receiving layer and the support is a release layer. The release layer can provide the desired adhesion balance to the receiver element so that the image-receiving layer adheres to the receiver element during exposure and separation from the donor element, but promotes the separation of the image receiving layer from the receiver element upon transfer, for example by lamination, of the image layer to a permanent support. The color image layer is thus between the permanent support (e.g., glass or polarizing element) and the image receiving layer, and the image receiving layer can act as a planarizing layer for the LCD device. Examples of materials suitable for use as the release layer include polyamides, silicones, vinyl chloride polymers and copolymers, vinyl acetate polymers and copolymers and plasticized polyvinyl alcohols. The release layer can have a thickness in the range of 1 to 50 microns. A cushion layer which is a deformable layer may also be present in the receiver element, typically between the release layer and the receiver support. The cushion layer may be present to increase the contact between the receiver element and the donor element when assembled. Examples of suitable materials for use as the cushion layer include copolymers of styrene and olefin monomers such as styrene/ethylene/butylene/styrene, styrene/butylene/styrene block copolymers, and other elastomers useful as binders in flexographic plate applications. Receiving elements suitable for use in color filter array applications are disclosed as transfer elements in U.S. Pat. No. 5,565,301 which is hereby incorporated by reference.

The receiver element does not have to be the final intended support for the imageable component. In other words, the receiver element can be an intermediate element and the laser imaging step can be followed by one or more transfer steps by which the imageable component is transferred to the final support. This is most likely the case for multicolor proofing applications in which the multicolor image is built up on the receiver element and then transferred to the permanent paper support. Similarly, in color filter array applications, the receiver element can be an intermediate element onto which a multicolor image in which the additive primary colors red, green, and blue are formed into a mosaic pattern in a black matrix, is built up. The color image can then be transferred, for example by lamination, to a receptor element such as, for example, a flexible glass substrate or a polarizing filter element associated with the LCD device. The glass substrate may optionally have one or more layers to receive/adhere the color image layer to glass. Examples of materials which are suitable to receive the color image to the glass substrate include ethylene copolymers, adhesion promotors, and UV crosslinkable adhesives. A particularly suitable polarizing filter element is one which is used for thin film transistor (TFT) color filters.

Photosensitive Receiver Element

A photosensitive receiver element, which is particularly suited for use as a receiver element in the embodiments of this invention involving fabrication of a photomask on the photosensitive element and subsequent use of the photomask to generate a relief image, comprises:

(a) a support;

(b) a photohardenable layer, comprising a binder, at least one photohardenable component, and an initiator or initiator system having sensitivity to actinic radiation;

(c) an optional barrier layer; and (d) an optional coversheet.

Figure 4:
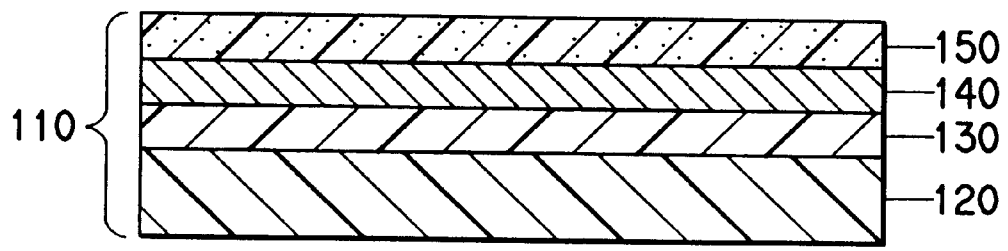
FIG. 4 illustrates a photosensitive receiver element (I 10) that consists of in sequence a support (120), a photohardenable layer (130), a barrier layer (140) (which is optional), and a coversheet (150)(which is optional).

A photosensitive receiver element of this type is depicted in FIG. 4.

The coversheet should provide the proper adhesion balance with the photohardenable layer and/or the optional barrier layer. Generally, the coversheet is a dimensionally stable polymeric film. The coversheet is generally a thin transparent film of polyester, polycarbonate, polyamide, fluoropolymers, polystyrene, polyethylene, polypropylene, or other strippable material. A preferred coversheet is polyethylene terephthalate. The coversheet typically has a thickness from 0.1 to 10 mils (0.00025 to 0.025 cm), with a preferred thickness of 0.5 to 5 mils (0.0013 to 0.013 cm).

Typically, the coversheet is removed prior to forming the assemblage of the photosensitive receiver element and the donor element. If the coversheet remains as a part of the assemblage, the coversheet should be transparent to actinic radiation so that the radiation passes through the coversheet to the photohardenable layer without significant diminution of intensity when exposed through the photomask formed by the donor element.

Figure 5:
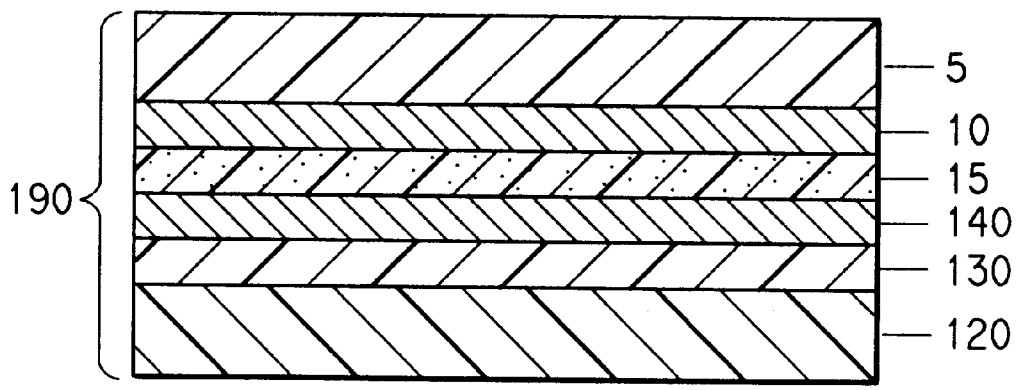
FIG. 5 illustrates a laserable assemblage (190) that is made by bringing donor element (1) in contact with photosensitive receiver element (110) after removal of coversheet (150), wherein transfer layer (15) is in contact with barrier layer (140).

Illustratively, a laserable assemblage (190) for this invention made using a photosensitive receiver element as described above (after removal of the coversheet) and a three layer donor element (as shown in FIG. 1) is depicted in FIG. 5. This laserable assemblage can be made by contacting (e.g., pressing together or laminating) donor element (1) and photosensitive receiver element (110) after removal of coversheet (150), wherein transfer layer (15) is in contact with barrier layer (140). Laserable assemblage (190) consists of in sequence a support (120), a photohardenable layer (130), a barrier layer (140) (which is optional), a transfer layer (15), a heating layer (10), and a flexible ejection layer (5).

In a laserable assemblage, it is frequently desirable to have at least one barrier layer, (c) interposed between the photohardenable layer of the photo-sensitive receiver element and the transfer or top layer of the donor element. The photohardenable layers can be inherently tacky, especially the photohardenable layers used to make flexographic printing plates. The barrier layer can be helpful in achieving the correct adhesion balance. In addition, the barrier layer prevents the migration of monomer, if present, from the photohardenable layer to the transfer or top layer. If the monomer is compatible with the materials used in the transfer or top layer and/or is migratory, monomer migration may occur with time and can drastically alter the adhesion balance. If the monomer is substantially incompatible with the transfer or top layer or substantially non-migratory, there may be no migration. But if there is even marginal compatibility, migration may occur. When the element is not imaged and developed immediately after it is put together, it is preferred that a barrier layer be present.

The barrier layer should be transparent to actinic radiation so that when the element is exposed to actinic radiation through the photomask created in or from the transfer or top layer or in the donor element, the radiation passes through the barrier layer to the underlying photohardenable layer without significant diminution in intensity.

The barrier layer should also initially (i.e., prior to exposure to actinic radiation) be soluble, swellable, or dispersible in the developer solvent for the photopolymerizable layer or it should be liftable in that solvent. By "liftable" it is meant that the solvent is able to lift off the barrier layer at least partially intact.

Two types of barrier layers can be used. The first type is one which is insensitive to actinic radiation and is soluble, swellable, dispersible or liftable in developer solutions for the photopolymerizable layer both before and after exposure to actinic radiation. This type of barrier layer is completely removed in both exposed and unexposed areas, along with the unexposed areas of the photopolymerizable layer, during processing with the developer.

Examples of materials which are suitable for use as the barrier layer of this first type include those materials which are conventionally used as a release layer in flexographic printing elements, such as polyamides, polyvinyl alcohol, hydroxyalkyl cellulose, copolymers of ethylene and vinyl acetate, amphoteric interpolymers, and combinations thereof. Polyamide is preferred.

The second type of barrier layer is one which is soluble, swellable or dispersible in the developer solvent prior to exposure to actinic radiation, but is not affected by the developer solvent after exposure to actinic radiation. When this type of barrier layer is used, it is removed by the developer solvent only in those areas which are not exposed to actinic radiation. The barrier layer which has been exposed to actinic radiation remains on the surface of the polymerized areas of the photopolymerizable layer and becomes the actual printing surface of the printing plate.

This type of barrier layer can be photosensitive itself, i.e., contain monomer and initiator, or it can become photosensitive when in contact with the photopolymerizable layer. This second type of barrier layer is usually a layer of an elastomeric composition. The composition can consist simply of a nonphoto-sensitive elastomeric binder layer similar to the binder in the photopolymerizable layer or it can be the binder in combination with a monomer and initiator. A preferred barrier layer is an elastomeric composition comprising an elastomeric polymeric binder, a second polymeric binder and optionally a nonmigratory dye or pigment. The elastomeric polymeric binder in the elastomeric composition is generally the same as or similar to the elastomeric binder present in the photopolymer layer. Suitable compositions for the barrier layer are those disclosed as elastomeric compositions in the multilayer cover element described in Gruetzmacher et al., U.S. Pat. Nos. 4,427,759 and 4,460,675.

It is also possible to use more than one barrier layer. For example, an elastomeric barrier layer can be present next to the photohardenable layer and this, in turn, can be overcoated with a barrier layer which is soluble both before and after exposure to actinic radiation. The exact choice of barrier layer(s) will depend on the nature of the photohardenable layer(s) of the photosensitive element and the transfer layer or top layer and other physical requirements of the laserable assemblage.

The support can be any material which is conventionally used with photosensitive elements and, in particular, those used to prepare flexographic printing plates or photoresists. Examples of suitable support materials include polymeric films such as those formed by addition polymers and linear condensation polymers, translucent foams and fabrics. A preferred support is polyester film; particularly preferred is polyethylene terephthalate. The support typically has a thickness from 2 to 10 mils (0.0051 to 0.025 cm), with a preferred thickness of 3 to 8 mils (0.0076 to 0.020 cm). In addition, the support can be subbed or surface treated to improve adhesion.

The photohardenable layer generally comprises a photoinitiator or photoinitiator system, which is sensitive to actinic radiation, and a component that is capable of reacting with the initiator, after it has been activated by exposure to actinic radiation. The interaction of the initiator and the component produces a change in the physical properties of the layer. The areas of the photohardenable layer which have been exposed to actinic radiation are differentiated from the areas which have not been exposed based on the photoinduced difference in the physical properties of the exposed and nonexposed areas. The types of physical property changes in photohardenable layers that can be used to advantage in the process of the invention include changes in solubility, swellability or dispersability, changes in softening point, changes in tackiness, changes in permeability for processing solution, and the like.

Of interest, particularly for the formation of relief images, are those systems in which exposure to actinic radiation effects a change in solubility in the photohardenable layer.

As used herein, the term "solubility" is intended to mean the ability to be removed by the action of a developer liquid and is intended to encompass swellability and dispersability, as well as complete solubility. The change in solubility can be an increase due to a photosolubilization reaction, or a decrease due to a photohardening reaction, either photocrosslinking or photopolymerization. Photosolubilization generally occurs by the reaction of a preformed polymer with either pendant reactive groups or other molecules to increase the solubility (or the rate of solubilization) of the photosensitive material. Photocrosslinking generally occurs by the crosslinking of a preformed polymer to form a less soluble crosslinked polymeric network. This can take place either through dimerization of pendant reactive groups attached directly to the polymer chain, or reaction of the polymer with a separate polyfunctional photoactive crosslinking agent. Photopolymerization generally occurs when relatively low molecular weight monomers or oligomers undergo photoinitiated cationic or free radical polymerization to form less soluble polymers.

Photohardenable materials are used as the photohardenable layer in the process of the invention. Photohardenable materials can be photocrosslinkable, photopolymerizable, or combinations of both. Photohardenable materials generally comprise a binder, a photoinitiator or photoinitiator system (hereinafter referred to as "photoinitiator system") and a photohardenable component, which is at least one of (i) a low molecular weight monomer or oligomer capable of undergoing polymerization, (ii) reactive groups pendant to the binder which are capable of reacting with each other or (iii) reactive groups pendant to the binder and a crosslinking agent capable of reacting with the reactive groups.

Materials which can be used as the binder include polymers and copolymers of acrylates, methacrylates, acrylamides, styrene, vinyl acetate and its partially hydrogenated derivatives, including amphoteric interpolymers. Also gelatin and cellulose esters and ethers, and elastomeric materials, such as polymers and copolymers of butadiene and isoprene can be used. The photoinitiator system is one which, upon irradiation with actinic radiation, forms a species which will initiate either free radical or cationic crosslinking or polymerization reactions. By actinic radiation, it is meant high energy radiation including but not limited to UV, visible, electron beam, and X-ray.

Most photoinitiator systems for free radical reactions in current use are based upon one of two mechanisms: photofragmentation and photoinduced hydrogen abstraction. Suitable photoinitiator systems of the first type include peroxides, such as benzoyl peroxide; azo compounds, such as 2,2'-azobis-(butyronitrile); benzoin derivatives, such as benzoin and benzoin methyl ether; derivatives of acetophenone, such as 2,2-dimethoxy-2-phenylacetophenone; ketoxime esters of benzoin; triazines; and biimidazoles. Suitable photoinitiator systems of the second type include anthraquinone and a hydrogen donor; benzophenone and tertiary amines; Michler's ketone alone and with benzophenone; thioxanthones; and 3-ketocoumarins.

Photoinitiator systems suitable for cationic crosslinking or polymerization reactions are those which, upon irradiation, produce a Lewis acid or a protonic Bronsted acid which is capable of initiating polymerization of ethylene oxide or epoxy derivatives. Most photoinitiator systems of this type are onium salts, such as diazonium, iodonium and sulfonium salts.

Sensitizing agents can also be included with the photoinitiator systems discussed above. In general, sensitizing agents are those materials which absorb radiation at a wavelength different than that of the reaction-initiating component, and are capable of transferring the absorbed energy to that component. Thus, the wavelength of the activating radiation can be adjusted.

As mentioned above, the binder can have pendant groups which are capable of undergoing free-radical induced or cationic crosslinking reactions. Pendant groups which are capable of undergoing free-radical induced crosslinking reactions are generally those which contain sites of ethylenic unsaturation, such as mono- and polyunsaturated alkyl groups; acrylic and methacrylic acids and esters. In some cases, the pendant crosslinking group can itself be photosensitive, as is the case with pendant cinnamoyl or N-alkyl stilbazolium groups. Pendant groups which are capable of undergoing cationic crosslinking reactions include substituted and unsubstituted epoxide and aziridine groups.

Monomers undergoing free-radical polymerization are typically ethylenically unsaturated compounds. Examples of which include acrylate and methacrylate esters of alcohols and their low molecular weight oligomers. Examples of suitable monomers and oligomers with two or more sites of unsaturation capable of undergoing free radical induced addition reactions, include the polyacrylate and polymethacrylate esters of polyols such as triethyleneglycol, trimethylolpropane, 1,6-hexanediol, and pentaerythritol, and their low molecular weight monomers. Esters of ethoxylated trimethyolol propane, in which each hydroxyl group has been reacted with several molecules of ethylene oxide, as well as monomers derived from bisphenol A diglycidyl ether and monomers derived from urethanes have also been used. Monomers which undergo cationic polymerization include mono- and polyfunctional epoxides and aziridines. In some cases, where there are residual reactive sites in the binder, e.g., residual unsaturation or epoxide groups, the crosslinking agent can also react with the binder.

Although, any of the above described photosensitive materials can be used in the process of the invention, photohardenable materials which are suitable for the preparation of flexographic printing plates and/or photoresists are preferred, and normally used, and are described in greater detail below.

For creating a relief image on a flexographic printing plate or with a photoresist according to this invention, the photohardenable material comprises a binder, at least one photohardenable component (e.g., a monomer) and an initiator system, where the initiator system has a sensitivity to actinic radiation. In most cases, the initiator will be sensitive to visible or ultraviolet radiation. Any photohardenable compositions which are suitable for the formation of flexographic printing plates or imaged resist patterns can be used for the present invention. Examples of suitable compositions for flexographic printing plates have been disclosed, for example, in Chen et al. U.S. Pat. No. 4,323,637, Gruetzmacher et al. U.S. Pat. No. 4,427,759 and Feinberg et al. U.S. Pat. No. 4,894,315.

For creating a relief image on a flexographic printing plate, an elastomeric binder is selected. The elastomeric binder can be a single polymer or mixture of polymers which can be soluble or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Worns U.S. Pat.

No. 4,517,279. Binders which are soluble or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene and isoprene/styrene thermoplastic-elastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231 can be used. It is preferred that the binder be present in at least an amount of 50% by weight of the photohardenable layer.

The term binder, as used herein, encompasses core shell microgels and blends of microgels and preformed macromolecular polymers, such as those disclosed in Fryd et al. U.S. Pat. No. 4,956,252.

For photoresist applications of this invention, the binder component of the photosensitive and/or photohardenable layer of the photosensitive element is preferably a carboxylic acid containing copolymer, such as those disclosed in U.S. Pat. Nos. 3,458,311 and 4,273,857, and can be prepared by any of the addition polymerization techniques known to those skilled in the art such as described therein. The level of carboxylic acid groups is determined for a given composition by optimizing the amount needed for good development in aqueous alkaline developer. Preferred binders are those comprised of comonomers of structural unit:

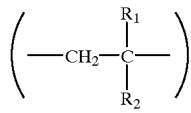

in which $R_1$ is H or alkyl; $R_2$ is phenyl or $CO_2R_3$; and $R_3$ is H or alkyl, which is unsubstituted or substituted with hydroxy, alkoxy, halide, carboalkoxy, and other substituents. Alkyl groups can contain one to twelve carbon atoms and preferably one to four. Comonomers, which are suitable for forming the binder copolymer, are styrene and unsaturated carboxylic acids and their derivatives, such as (meth)acrylic acid and (meth)acrylates. Acrylic acid, methacrylic acid, methyl methacrylate, styrene, ethyl acrylate, ethyl methacrylate, butyl methacrylate and butyl acrylate are preferred.

The binder copolymers of the invention can be formed by direct copolymerization of one or more ethylenically unsaturated dicarboxylic acid anhydrides, or the corresponding alkyl diesters, with one or more of the above comonomers. Suitable ethylenically unsaturated dicarboxylic acid anhydrides are, for example, maleic anhydride, itaconic acid anhydride and citraconic acid anhydride and alkyl diesters such as the diisobutyl ester of maleic anhydride. The copolymer binder containing acid anhydride functionality can be reacted with primary aliphatic or aromatic amines.

When the photosensitive element is used in a laserable assemblage and subsequently processed to create a resist relief image, development of the composition requires that the binder material should contain sufficient carboxylic acid groups to render the photoresist coating composition processable in aqueous alkaline developer. The coating layer formed from the element will be removed in portions which are not exposed to radiation but will be substantially unaffected in exposed portions during development by aqueous alkaline liquids such as wholly aqueous solutions containing 1% sodium or potassium carbonate by weight for a time period of up to two minutes at a temperature of 30° C. The acid number of the copolymer binder should be within the range of 5 to 500 and preferably from about 20 to 250.

The quantity of total copolymeric binder in the photohardenable layer is from about 10 to 90 parts by weight of the photohardenable layer composition.

One or more cobinders may be present to optimize manufacturability, development or stripping properties, or performance in printed circuit process steps such as electrolytic copper plating or copper etching.

The photohardenable layer can contain a single monomer or mixture of monomers which should be compatible with the binder to the extent that a clear, non-cloudy photosensitive layer is produced. Monomers that can be used in the photohardenable layer are well known in the art. Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. It is preferred that the monomer be present in at least an amount of 5% by weight of the photohardenable layer.

The photoinitiator system can be any single compound or group of compounds which is sensitive to actinic radiation, generating free radicals which initiate the polymerization of the monomer or monomers without excessive termination. The photoinitiator is generally sensitive to visible or ultraviolet radiation, preferably ultraviolet radiation. It should be thermally inactive at and below 185° C. Examples of suitable photoinitiators include the substituted and unsubstituted polynuclear quinones. Examples of suitable systems have been disclosed in Gruetzmacher et al., U.S. Pat. No. 4,460,675 and Feinberg et al., U.S. Pat. No. 4,894,315. Photoinitiators are generally present in amounts from 0.001% to 10.0% based on the weight of the photohardenable composition.

The photohardenable layer can contain other additives depending on the final properties desired. Such additives include thermal polymerization inhibitors, sensitizers, plasticizers, colorants, antioxidants, antiozonants, fillers or reinforcing agents.

The photohardenable layer can be prepared in many ways by admixing the binder, monomer, initiator, and other ingredients. It is preferred that the photohardenable mixture be formed into a hot melt and then calendered to the desired thickness. An extruder can be used to perform the functions of melting, mixing, deaerating and filtering the composition. The extruded mixture is then calendered between the support and a temporary, removable coversheet. The temporary coversheet is generally previously coated with a barrier layer. The adhesion between the barrier layer and the temporary coversheet should be low, so that the barrier layer will remain intact on the photohardenable layer when the temporary coversheet is removed, which is normally done just prior to use in making a laserable assemblage. Alternatively, the photohardenable material can be placed between the support and the barrier layer coated temporary coversheet in a mold. The layers of material are then pressed flat by the application of heat and/or pressure.

It is particularly advantageous to make the photosensitive element in the form of a continuous printing element. A flat sheet photosensitive receiver element, i.e., the support, photosensitive layer and barrier layer, can be reprocessed by wrapping the element around a cylindrical form, usually a printing sleeve or the printing cylinder itself, and fusing the edges of the photosensitive layer together to form a seamless, continuous element. The donor element on a donor support can then be wrapped around the continuous photosensitive element (receiver element), such that the transfer or top layer is adjacent to the barrier layer. The transfer or top layer, as well as other layers of the donor element, can also be made in sleeve form, and slipped over the continuous photosensitive element. The resulting structure is a laserable assemblage. In a preferred method, the photohardenable layer is wrapped around the cylindrical form and the edges joined. One process for joining the edges has been disclosed in German Patent DE 2844426. The photohardenable layer can then be spray coated with at least one barrier layer. The donor element is then wrapped around the element such that the transfer layer or top layer is adjacent to the barrier layer. The element is then imagewise exposed to laser radiation in fabricating the photomask, the donor support is removed, and the continuous element is exposed to actinic radiation and developed.

Continuous printing elements have applications in the flexographic printing of continuous designs such as in wallpaper, decoration and gift wrapping paper. Furthermore, such continuous printing elements are well-suited for mounting on conventional laser equipment. The sleeve or cylinder on which the printing element is wrapped when the edges are fused, can be mounted directly into the laser apparatus where it functions as the rotating drum during the laser exposure step.

Unless otherwise indicated, the term "flexographic printing plate or element" encompasses plates or elements in any form suitable for flexographic printing, including, but not limited to, flat sheets and seamless continuous forms.

As discussed above, to prepare a flexographic printing plate, the laserable assemblage, consisting of the donor element and the photosensitive element (receiver element), is first imagewise exposed to infrared laser radiation in the thermal imaging step to effect fabrication of a photomask on the photosensitive element. This results in an actinic radiation opaque mask which adheres to the photohardenable layer (or barrier layer or coversheet) in a pattern. The element is exposed overall to actinic radiation, preferably UV radiation through the mask, and then developed to remove the unexposed areas of the photohardenable layer, i.e., those areas which have not been photohardened. If a barrier layer is present, it is removed in at least the unexposed areas.

Developers which can be used with the photohardenable elements which are used to prepare flexographic printing plates include organic solvent developers, aqueous and semi-aqueous solutions. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 3828551. Suitable semi-aqueous developers usually contain water and a water miscible organic solvent and an alkaline material. Suitable aqueous developers contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. For photohardenable systems, washout is frequently carried out in an automatic processing unit which uses developer and mechanical brushing action to remove the unexposed portions of the plate, leaving a relief constituting the exposed image and the floor.

Following development, the relief printing plates are generally blotted or wiped dry, and then dried in a forced air or infrared oven. Drying times and temperatures may vary, however, typically the flexographic plate is dried for 60 to 120 minutes at 60° C. High temperatures are not recommended because the support can shrink and this can cause registration problems.

Additional process steps can be carried out in the preparation of flexographic printing plates from elastomeric photohardenable elements.

One additional step is to give the element a blanket exposure to actinic radiation through the support. This exposure, generally called a backflash exposure, is used to create a shallow layer of photohardened material, or a floor, on the support side of the photohardenable layer and to sensitize the photohardenable layer. The floor provides improved adhesion between the photohardenable layer and the support and also established the depth of the plate relief. This backflash exposure can take place before, after or during the other imaging steps. It is preferred that this step take place immediately prior to the exposure step through the radiation opaque mask. Any conventional sources of actinic radiation can be used for this exposure step. Exposure times for the backflash generally range from a few seconds up to about a minute.

Most flexographic printing plates are uniformly post-exposed to ensure that the photohardening process (e.g., photopolymerization or photocrosslinking) is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, U.S. Pat. Nos. 4,400,459, 4,400,460 and German Patent 28 23 300. Detackification can also be accomplished by exposure to radiation sources having a wavelength not longer than 300 nm, as disclosed in European Published Patent Application 0017927 and Gibson U.S. Pat. No. 4,806,506.

Process Steps

1. Exposure

The first step in the process of the invention is imagewise exposing the laserable assemblage to laser radiation. The laserable assemblage comprises the donor element and the receiver element, described above.

The assemblage is prepared usually following removal of coversheet(s), if present, by placing the donor element in contact with the receiver element such that the transfer layer or top layer coating actually touches the receiver support or the image-receiving layer on the receiver element. In some instances the coversheet is not removed, in which case the transfer layer or top coating touches the coversheet of the receiver element. Vacuum and/or pressure can be used to hold the two elements together. As one alternative, the donor and receiver elements can be held together by fusion of layers at the periphery. As another alternative, the donor and receiver elements can be taped together and taped to the imaging apparatus, or a pin/clamping system can be used. As yet another alternative, the donor element can be laminated to the receiver element to afford a laserable assemblage. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.).

The exposure can take place through the flexible ejection layer of the donor element or through the receiver element, provided that these are substantially transparent to the laser radiation. In most cases, the donor flexible ejection layer will be a film which is transparent to infrared radiation and the exposure is conveniently carried out through the flexible ejection layer. However, if the receiver element is substantially transparent to infrared radiation, the process of the invention can also be carried out by imagewise exposing the receiver element to infrared laser radiation.

The laserable assemblage is exposed imagewise so that material, i.e., the binder and the imageable component, is transferred to the receiver element in a pattern. The pattern itself can be, for example, in the form of dots or line work generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect to each other, such that each minute area of the assemblage, i.e., "pixel" is individually addressed by the laser. This is generally accomplished by mounting the laserable assemblage on a rotatable drum. A flat bed recorder can also be used.

For donor elements of this invention that are used to make a photomask on a photosensitive element for subsequent use in making a relief image, the material transferred from the donor to the receiver and which becomes a mask area, or, alternatively, in other embodiments the material remaining on the donor as a mask area should be "substantially opaque to actinic radiation". The term "substantially opaque to actinic radiation" means that the amount of actinic radiation transmitted to the underlying photosensitive layer or photohardenable layer is so miniscule that no significant amount of photoinduced reaction occurs in the photosensitive or photohardenable layer. The material of the donor element may be transferred to the coversheet or the barrier layer or the photohardenable layer of the photosensitive receiver element.

2. Separation

The next step in the process of the invention is separating the donor element from the receiver element. Usually this is done by simply peeling the two elements apart. This generally requires very little peel force, and is accomplished by simply separating the donor support from the receiver element. This can be done using any conventional separation technique and can be manual or automatic without operator intervention.

Throughout the above discussions, the intended product has been the receiver element, after laser exposure, onto which the imageable component has been transferred in a pattern. However, it is also possible for the intended product to be the donor element after laser exposure. If the donor support is transparent, the donor element can be used as a phototool for conventional analog exposure of photosensitive materials, e.g., photoresists, photopolymer printing plates, photosensitive proofing materials, medical hard copies, and the like. For phototool applications, it is important to maximize the density difference between "clear", i.e., laser exposed and "opaque", i.e., unexposed areas of the donor element. Thus the materials used in the donor element should be tailored to fit this application.

3. Formation of multicolor images

In proofing and color filter array applications, the receiver element can be an intermediate element onto which a multicolor image is built up. A donor element having a first imageable component in the transfer layer is exposed and separated as described above. The receiver element has an image formed with the first imageable component. Thereafter, a second donor element having a imageable component in the transfer layer different than that of the first donor element forms a laserable assemblage with the receiver element having the image of the first imageable component and is imagewise exposed and separated as described above. The steps of (a) forming the laserable assemblage with a donor element having a different imageable component than that used before and the previously imaged receiver element, (b) exposing, and (c) separating are repeated as often as necessary in order to build the multicolored image of a color proof or color filter array on the receiver element. The color image on the receiver element (which is an intermediate receiver element) can then be transferred for example by lamination to a permanent substrate, such as paper for proofing applications, or to a receptor element of a flexible glass substrate or polarizing filter element of an LCD device for color filter array applications. After lamination, the intermediate receiver element is separated from the permanent substrate or receptor (i.e, paper, or glass or polarizing element), to complete the transfer of the color image. Upon separation, the image-receiving layer may remain with the pigmented layer/s forming color filter on the LCD. The image-receiving layer can then act as a planarizing layer to provide a substantially planar layer on the outer surface of the LCD device and thereby obscure any nonuniformities in the thickness of the color filter layer.

4. Additional Processing for Photomask Embodiments

For the embodiments of this invention that involve fabrication of a photomask on a photosensitive element and subsequent use of the photomask to create a relief image, there are additional processing steps, which are discussed below. These additional processing steps will normally include, but are not limited to, imagewise exposure of the photosensitive element to create areas that are photohardened and with other areas still present that remain unphotohardened (areas that remain photohardenable). A subsequent development step to remove unphotohardened material is done under conditions where the areas that are photohardened remain during the course of development, thus creating a relief image on what was the photosensitive element with use of the photomask. Additional details are presented below.

The imagewise exposure is often achieved, but is not limited to, overall exposing the photosensitive element with actinic radiation through the photomask after fabrication of the photomask on the photosensitive element. The type of radiation used is dependent on the type of photoinitiator in the photohardenable layer, and can include, but is not limited to, ultraviolet (UV), visible, and near-infrared radiation. The actinic radiation-opaque material in the photomask on the photohardenable layer prevents the material beneath from being exposed to the actinic laser radiation. For photohardenable systems, those areas covered by the actinic radiation-opaque mask do not polymerize or crosslink. The areas not covered by the actinic radiation-opaque mask are exposed to actinic radiation and photoharden. Most photoinitiators are sensitive to visible or UV radiation. Examples of suitable visible or UV sources include carbon arcs, mercury-vapor arcs, fluorescent lamps, electron flash units electron beam units and photographic flood lamps. The most suitable sources of UV radiation are the mercury-vapor lamps, particularly the sun lamps. A standard radiation source is the Sylvania 350 Blacklight fluorescent lamp (FR48T12/350 VL/VHO/180, 115 w) which has a central wavelength of emission around 354 nm.

It is contemplated that both the imagewise exposure of a laserable assemblage to actinic radiation during thermal imaging to create a photomask on a photosensitive element and the subsequent overall exposure to actinic radiation (to create areas that are photohardened while other areas remain unphotohardened) can be carried out in the same equipment. It is preferred that this be done using a drum i.e., the photosensitive element is mounted on a drum which is rotated to allow for exposure of different areas of the element.

For photohardenable systems, it is preferred that this exposure step be carried out in the absence of oxygen. The photohardening reactions will take place when oxygen is present, but they require longer exposure times and the results are less reproducible. The element can be placed in a vacuum frame for the exposure step. If the surface of the photohardenable layer is tacky some type of releasable covering should be put over the layer to prevent it from sticking to the cover in the vacuum frame. Exposure can also be carried out in an inert atmosphere, e.g., nitrogen, or with the surface being swept with an inert atmosphere.

If a barrier layer is present, it will effectively prevent the interaction of oxygen with the photohardenable layer and, thus, the exposure step can be carried out in the presence of atmospheric oxygen.

The actinic radiation exposure time can vary from a few seconds to minutes, depending upon the intensity and spectral energy distribution of the radiation, its distance from the photosensitive element, and the nature and amount of the photosensitive composition (e.g., photohardenable composition). Typically for the photosensitive elements of this invention, a mercury vapor arc or a sunlamp is used at a distance of about 1.5 to about 60 inches (3.8 to 153 cm) from the element. Exposure temperatures are preferably ambient or slightly higher, i.e., about 20° C. to about 35° C.

Following overall exposure to actinic radiation through the photomask formed by the actinic radiation-opaque material, the image is developed to form a relief. The development step is based on the differences in physical properties between the areas of the photohardenable layer which have been exposed to actinic radiation, and those areas which have not been exposed. Development may involve, e.g., washing out the more soluble portions of the photohardenable layer, or transfer of areas of the photohardenable layer to another substrate. When systems are used in which exposure to actinic radiation results in differences in solubility, development is accomplished by washing with a suitable developer solvent. Development is usually carried out at about room temperature. The developers can be organic solvents, aqueous or semi-aqueous solutions. The choice of the developer will depend on the chemical nature of the photosensitive material (e.g., material in the photohardenable layer of the photosensitive element) to be removed.

The following terms are used throughout the specification and/or examples and have the meaning set forth below.

DEFINITIONS

| | |
|---|---|
| DSC | Differential scanning calorimetry, which is a well-known thermal analysis technique useful for determination of Tg values and other characteristic temperatures. |
| Td | Thermal decomposition temperature for a given polymer measured in ° C. This value is usually determined using a thermal analysis method such thermal gravimetric analysis or differential scanning calorimetry (DSC). |
| GTT | Glass transition temperature for a given polymer. The GTT or Tg of a polymer is a type of second order transition. It is defined to be the characteristic temperature for a polymer being heated that represents a phase change from a glassy state (below Tg) to a rubbery, flexible state (above Tg). Generally, if a polymer has a highly flexible chain, it will have a low Tg, whereas, if a polymer is rigid, it will have a high Tg. For a given polymer at a temperature below its Tg, the polymer will be hard and glassy; for the polymer at a temperature above its Tg, it is soft and flexible. The Tg of a given polymer is often determined by DSC. |
| Tg0 | This is the glass transition temperature for a given polymer measured by DSC on a sample of the polymer that is either pure polymer containing no plasticizer or is at most only lightly plasticized polymer, such that the measured glass transition temperature is within ±3° C. of that for the unplasticized polymer. This temperature is a characteristic temperature for a given polymer. This temperature is in ° C. unless indicated otherwise. |
| Tg1 | This is the glass transition temperature for a given polymer measured by DSC on a sample of the polymer that contains one or more known plasticizers, such that the measured glass transition temperature of the sample is now Tg1 instead of Tg0, wherein Tg0–Tg1 > 3° C. This temperature (Tg1) is a characteristic temperature for a given polymer that is plasticized with a given plasticizer(s) to a given extent (degree of plasticization, percentage of plasticizer present, etc.). |
| Modulus (Mod.) | This is the tensile modulus or simply modulus of the sample measured on an Instron ® unit. |
| Stress Strain Curves | These are determined by measuring continuously the force developed on a sample when elongated at constant rate of extension. The stress-strain curve serves to define several quantities including modulus, yield stress and elongation at break. Modulus in the slope of the curve. |
| Sensitivity (Sens.) | This is the sensitivity, or ablation threshold, of the transfer element, and it corresponds to the minimum laser fluence required for transfer or material removal to occur. The fluence is the laser energy per unit area (e.g., millijoules per cm$^2$). |

The following binders are readily utilized in the present invention or are binders for comparative examples.

Ejection Layer Binders:

CPVC Chlorinated Poly(vinyl chloride)

PVC poly(vinyl chloride) (Aldrich) Td1=282° C., Td2= 465° C. PVC1-#=polyvinyl chloride Tg=84° C. (Flexmark Corporation)

PVC2-#=polyvinyl chloride Tg=33° C. (Plastic Film Corporation of America)

PVC3-#=polyvinyl chloride Tg=64° C. (VCF Films, Inc.)

\# is ejection layer thickness in mils as shown in the examples section.

Transfer Layer Polymers:

PEO Polyethylene Oxide (E. I. du Pont de Nemours and Company, Wimington, DE (DuPont) Td=457° C.

A//B n-BMA (10)/MMA (5)//MAA (10)—an A//B block copolymer prepared by GTP (see U.S. Pat. No. 4,417, 034).

Other Materials:

CyHex Cyclohexanone (Aldrich)

MEK Methyl ethyl ketone (Aldrich)

PET Polyethylene terephthalate (DuPont Mylar® 200D)

EXAMPLES

These non-limiting examples demonstrate the processes and imaged laserable assemblages claimed and described herein. All temperatures throughout the specification are in ° C. (degrees Centigrade) and all percentages are weight percentages unless indicated otherwise.

The sensitivity (film sensitivity or donor element sensitivity), or ablation threshold, of a given donor element was defined to be the minimum laser fluence (LF, measured in $mJ/cm^2$) required for transfer of material to occur from the donor element to a given receiver element in a laserable assemblage during thermal imaging, with the transferred material having a density (optical density) of at least 0.005. (At the ablation threshold, the optical density of transferred material is very low (e.g., ~0.005) but still distinguishable over a optical density of zero.)

The thermal imaging in these examples was effected using a CREO exposure engine (Creo Products Inc., Vancouver, British Columbia, Canada). The system used contains a rotating external drum 30 inches (76.2 cm) long and 12 inches (30.5 cm) in diameter. Samples were mounted on the rotating external drum. This CREO exposure engine contains a laser head outputting 32 individually modulated beams of approximately 70 milliwatts each, which were individually focused to approximately 7 micron spots on the sample. The rotating drum was 1 meter in circumference. The rotating drum can be spun at speeds ranging from 30 to 450 RPM to produce surface speeds on the drum ranging from 0.5 to 7.5 meters/second. Samples were held in place with adhesive tape and vacuum assist. The laser head, patented under U.S. Pat. No. 4,743,091, consisted of thirty-two approximately 830 nm, laser diodes, each with approximately 90 milliwatts of single-mode output. The laser diodes were arranged in a two dimensional 6×6 pattern of rows and columns, with columns 1 through 5 populated with 6 lasers and column 6 populated by 2 lasers. Output of each laser was passed through a collimation lens which was adjusted to focus each laser output on a plane 252 mm from the collimation lens. A two element zoom lens was used to image the 6×6 array onto the sample surface and was adjusted to determine a given spot size. Total power on a given sample was approximately 2240 milliwatts.

A laserable assemblage, consisting of a donor element and a receiver element (i.e., a flexographic printing element), was written with the above array of 32 infrared diode lasers writing at 830 nm at 1 microsecond pulse width. Beam size was adjusted to 5.8 microns, and the drum speed was varied in 25 RPM increments from 100 RPM to 300 or 400 RPM in these examples.

In these examples, the receiver element in each case was a Cyrel® 67HOS flexographic printing plate (DuPont). The cover sheet was removed and the release (barrier) layer of the printing plate was contacted with the transfer layer of the donor element to form the laserable assemblage of a given example. The laserable assemblage was mounted on the drum of the CREO exposure unit and imaged as described in each example.

EXAMPLES 1–3

These examples illustrate the effect of laser fluence on the durability of the transferred mask for three layer donor elements having transfer layer coating formulations with or without high decomposition temperature polymers (binders). The three layer donor element used in these examples consisted of the following layers in the sequence listed: a four mil polyvinyl chloride (PVC) flexible ejection layer, 90 Å of nickel sputtered onto the ejection layer, and a transfer layer that is pigmented and having the specific formulation indicated below (transfer layer A, transfer layer B, or transfer layer C). The PVC ejection layer was metallized with nickel by Flex, Inc. (Santa Rosa, Calif.) by sputtering Ni to 41% transmission (~90 Å). The metal thickness was monitored in situ using a quartz crystal and after decomposition by measuring the reflection and transmutation of the metallized PVC. In each case, the transfer layer was hand coated using a wire rod #4 which resulted in a transfer layer thickness which ranged from about 0.7 to 1.0 micron upon drying at ambient temperature. This resulting three layer donor element was then used together with a Cyrel® 67HOS flexographic printing plate to form the laserable assemblage of this example, which was assembled and mounted on the CREO drum in the manner given below.

The flexographic printing plate was first mounted on the CREO drum with the photopolymer layer being outwards. The three layer donor element was placed directly on top of the photopolymer layer of the flexographic printing plate by taping a leading edge and contacting the donor element with the photopolymer layer starting at the leading edge and going to the trailing edge. Once the laserable assemblage was formed, it was taped to drum and held in place by vacuum assist.

The PVC ejection layer was highly elasticized medical grade material with glass transition of 64° C. The glass transition temperatures were determined by differential scanning calorimetery using a DSC instrument from TA Instruments (Wilmington, Del.). A thermogravometric analysis (TGA) showed that the film has a decomposition curve with roughly 60% weight loss by 300° C. The main decomposition peak observed ranged between 282 and 288° C.

The densities listed below represent the density of the transfer layer that, upon laser imaging with the CREO exposure unit, was transferred onto release (barrier) layer of the flexographic plate (receiver element) at the specified drum speed (and therefore, sensitivity). Densities were measured using a McBeth reflection densitometer (MacBeth, New Burgh, N.Y.). The following examples illustrate the film sensitivity as a function of the transfer layer formulation.

The densities of the black transfer layer transferred onto the flexographic printing plate (receiver element) at the different drum speeds are listed in Table 1 for transfer layer A, transfer layer B, and transfer layer C. The durability of the transferred mask is specified in the last column. (Transfer layer A, transfer layer B, and transfer layer C were obtained upon coating and drying of transfer coating A, transfer coating B, and transfer coating C, respectively.) The black dispersion used contains a carbon black/dispersant. The dispersant used is an A/B type block copolymer of a composition having n-butyl methacrylate (10)/methyl methacrylate (5)//methacrylic acid (10) as comonomers for the A and B blocks, respectively. This block copolymer is hereinafter designated as n-BMA(10)/MMA(5)//MAA(10). It had been neutralized with ammonium hydroxide. It had been prepared by group transfer polymerization (see U.S. Pat. No. 4,417,034).

The transfer coating A–C compositions were as indicated below:

Transfer Coating A (0% PEO)
    50 grams of carbon black pigment and a 15% n-MBMA (10)/MMA(5)//MAA(10) dispersion in water
    0.833 grams of ammonium carbonate 8.054 grams of water
% solids=15%
Transfer Coating B (20% PEO based on amount of PEO+ transfer coating A)
  2.5 grams of PEO as an aqueous solution (15%)
  10 grams of transfer coating A was made as shown above
Transfer Coating C (30% PEO based on amount of PEO+ transfer coating A)
  4.26 grams of PEO as an aqueous solution (15%)
  10 grams of transfer coating A, where transfer coating A was made as shown above
  The weight ratio of carbon black pigment to n-BMA(10)/MMA(5)//MAA(10) block copolymer in this example is 2:1. The carbon black pigment was Degussat FW18 (Degussa Co., Germany).

The density values and durability data obtained in these examples are ted in Table 1.

TABLE 1

|  |  | Density | | | Durability | | |
| --- | --- | --- | --- | --- | --- | --- | --- |
| DS | S | TLA-Ex 1 | TLB-Ex 2 | TLC-Ex 3 | DA-Ex 1 | DB-Ex 2 | DC-Ex 3 |
| 100 | 770 | 2.56 | 1.73 | 1.31 | n | n | y |
| 125 | 616 | 2.57 | 2.69 | 1.71 | n | y | y |
| 150 | 513 | 2.39 | 3.01 | 2.12 | n | y | y |
| 175 | 440 | 2.42 | 3.02 | 2.27 | n | y | y |
| 200 | 385 | 2.47 | 2.18 | 2.18 | n | y | y |
| 225 | 342 | 2.68 | 1.61 | 1.5 | n | y | y |
| 250 | 308 | 2.65 | 1.3 | 1.27 | n | y | y |
| 275 | 280 | 2.59 | 1.11 | 1.19 | y | y | y |
| 300 | 257 | 2.55 | 1.00 | 1.09 | y | y | y |
| 325 | 244 | 2.45 | 0.9 | 0.94 | y | y | y |
| 350 | 226 | 2.51 | 0.87 | 0.87 | y | y | y |
| 375 | 211 | 2.49 |  |  | y |  |  |
| 400 | 198 | 2.47 |  |  | y |  |  |

DS = drum rotation speed in revolutions per minute (rpm).
TLA = transfer layer A.
TLB = transfer layer B.
TLC = transfer layer C.
DA = durability of image (photomask) on flexographic printing plate upon laser imaging using donor element having TLA.
DB = durability of image (photomask) on flexographic printing plate upon laser imaging using donor element having TLB.
DC = durability of image (photomask) on flexographic printing plate upon laser imaging using donor element having TLC.
S = film sensitivity in mJ/cm$^2$
n = material is removed (not durable).
y = no material removed (durable).

For DA, DB, and DC, n=not durable and y=durable when durability of transferred image is measured by rubbing a finger over the transferred image and noting by visual observation whether any detectable material is removed (not durable) or not removed (durable), respectively.

In Example 1, the transfer coating A contains a polymer (i.e., the block copolymer dispersant) having a relatively low decomposition temperature, which is within the scope of this invention. In Example 2 or Example 3, the transfer coating B or transfer coating C contains an additional polymer (i.e., PEO) having a high decomposition temperature ($T_d$~457° C.).

As indicated in Table 1, donor elements containing transfer layer A (TLA) having only a relatively low decomposition temperature binder ($T_d$=~284° C., within the scope of the invention) exhibited significantly higher optical density values (see column labeled "TLA-Ex 8" in Table 1) versus corresponding donor elements containing transfer layer B (TLB) or transfer layer C (TLC) with a high decomposition temperature binder (outside the scope of the invention) (e.g., see column labeled "TLB-Ex 2" or "TLC-Ex 3" in Table 1).

Furthermore, the former optical density values (obtained with inventive donor elements having transfer layer A) did not drop significantly with increasing drum rotation speed (RPM) relative to the latter optical density values (obtained with comparative donor elements having transfer layer B or transfer layer C). Very significantly, while transferred coatings upon thermal imaging containing transfer layer A did not exhibit durability under conditions of high laser fluence levels (i.e., low drum speeds in the 100–250 rpm range and with sensitivities in the 308–770 mJ/cm$^2$ range), surprisingly and unexpectedly transferred coatings upon thermal imaging containing transfer layer A did exhibit durability under conditions of relatively low laser fluence levels (i.e., relatively high drum speeds in the 275–400 rpm range and with relatively low sensitivities in the 198–280 mJ/cm$^2$ range). In the latter case with use of transfer layer A at low sensitivities, the resulting transferred images were characterized to be both durable and to have unexpectedly high optical density values, which values did not significantly decrease in magnitude with increasing drum rotation speed (relative to those observed with transfer layer B or transfer layer C). Both of these factors are highly desirable.

EXAMPLES 4–5

These examples illustrate the effect of laser fluence on the durability of the transferred mask for four layer donor elements having transfer coating formulations with or without high decomposition temperature polymers (binders). The four layer donor element used in these examples consisted of the following layers in the sequence listed: a 2 mil PET support layer (DuPont Mylar® 200D), a one micron PVC ejection layer, a heating layer of 80 Å of nickel sputtered onto the ejection layer, and a transfer layer coating that is pigmented and having the specific formulation indicated below (transfer layer A or transfer layer C).

The ejection layer was coated onto a 10 inch width PET support using a continuous coater operated at a line speed of 100 feet/minute. The die was set up using a 4 mil shim, and the drier temperature was 160° F. (71° C.) in all sections. The ejection layer thickness was 2 microns upon coating in each case, which corresponds to a coating weight of 20 mg/dm$^2$. In order to avoid cracking of the ejection layer during sample handling, 9.1% by weight of diphenyl phthalate was added as plasticizer to the formulation. The Tg of coated samples of this PVC formulation was about 55° C. for the PVC layer alone. The solids in the PVC solution were adjusted to viscosities of 300–400 centipoise. The solvent was methyl ethyl ketone (60%) and cyclohexanone (40%). The solutions were filtered in line with a 5 micron filter, and a 1 mil polyethylene cover sheet was laminated to the outer surface of the ejection layer during coating in order to protect the ejection layer from scratches and dust prior to sputtering of the metallic heating layer.

The 2-layer support/ejection sample which resulted was then metallized with nickel by Flex, Inc. (Santa Rosa, Calif.) by sputtering Ni to 40% transmission (~80 Å to from the heating layer). The metal thickness was monitored in situ using a quartz crystal and after decomposition by measuring the reflection and transmutation of the metallized PVC. In each case, the transfer layer was hand coated using a wire rod #4 which resulted in a transfer layer thickness of about 1.0 micron upon drying at ambient temperature. This resulting four layer donor element was then brought in contact with the Cyrel® 67HOS flexographic printing plate to form the laserable assemblage of this example. The laserable assemblage was mounted on the drum in the same manner as given in Examples 1–3.

The densities listed below represent the density of the (pigmented) transfer layer that, upon laser imaging, was transferred onto a flexographic printing plate at the specified drum speed (and therefore, sensitivity). Densities were measured using a McBeth reflection densitometer (MacBeth, New Burgh, N.Y.). The following examples illustrate the film sensitivity as a function of the transfer layer formulation.

The densities of the black transfer layer transferred onto the release/barrier layer of the flexographic printing plate upon thermal imaging at the different drum speeds are listed in Table 2 for transfer layer A and transfer layer C. The durability of the transferred mask is specified in the last column. (Transfer layer A and transfer layer C were obtained upon coating and drying of transfer coating A and transfer coating C, respectively.)

The black dispersion used contains a carbon black/dispersant. The dispersant used is an A/B type block copolymer of a composition having n-butyl methacrylate (10)/methyl methacrylate (5)//methacrylic acid (10) as comonomers for the A and B blocks, respectively. This block copolymer is hereinafter designated as n-BMA(10)/MMA(5)//MAA(10). It had been neutralized with ammonium hydroxide. It had been prepared by group transfer polymerization (see U.S. Pat. No. 4,417,034).

The composition of the ejection layer coating and of transfer coating A and transfer coating C were as indicated below:

Ejection Layer

| | |
|---|---|
| PVC | 1500 grams |
| Diphenyl phthalate | 150 grams |
| Methyl ethyl ketone | 9000 grams |
| Cyclohexanone | 6000 grams |

Transfer Coating A (0% PEO)

50 grams of carbon black pigment and a 15% n-BMA(10)/MMA(5)//MAA(10) dispersion in water 0.833 grams of ammonium carbonate 8.054 grams of water % solids=15%

Transfer Coating C (30% PEO based on amount of PEO+ transfer coating A)

4.26 grams of PEO as an aqueous solution (15%)

10 grams of transfer coating A, where transfer coating A was made as shown above The weight ratio of carbon black pigment to n-BMA(10)/MMA(5)//MAA(10) block copolymer used in this example is 2:1. The carbon black pigment was Calvin Black (Degussa Co., Germany).

The density values and durability data obtained in these examples are presented in Table 2.

TABLE 2

| | | Density | | Durability | |
|---|---|---|---|---|---|
| DS | S | TLA-Ex 4 | TLC-Ex 5 | DA-Ex 4 | DC-Ex 6 |
| 100 | 770 | 1.66 | 1.42 | n | y |
| 125 | 616 | 2.07 | 1.43 | n | y |
| 150 | 513 | 2.50 | 1.42 | n | y |
| 175 | 440 | 2.38 | 1.44 | y | y |
| 200 | 385 | 2.47 | 1.45 | y | y |

TABLE 2-continued

| | | Density | | Durability | |
|---|---|---|---|---|---|
| DS | S | TLA-Ex 4 | TLC-Ex 5 | DA-Ex 4 | DC-Ex 6 |
| 225 | 342 | 2.30 | 1.41 | y | y |
| 250 | 308 | 2.21 | 1.21 | y | y |
| 275 | 280 | 1.90 | 1.11 | y | y |
| 300 | 257 | 1.52 | 1.01 | y | y |
| 325 | 244 | 1.36 | 0.89 | y | y |
| 350 | 226 | 1.31 | 0.85 | y | y |
| 375 | 211 | 1.21 | | y | |
| 400 | 198 | 1.18 | | y | |

DS = drum rotation speed in revolutions per minute (rpm).
TLA = transfer layer A.
TLC = transfer layer C.
DA = durability of image (photomask) on flexographic printing plate upon laser imaging using donor element having TLA.
DC = durability of image (photomask) on flexographic printing plate upon laser imaging using donor element having TLC.
S = film sensitivity in $mJ/cm^2$
n = material is removed (not durable).
y = no material removed (durable).

For DA and DC, n=not durable and y=durable when durability of transferred image is measured by rubbing a finger over the transferred image and noting by visual observation whether any detectable material is removed (not durable) or not removed (durable), respectively.

In Example 4, the transfer coating A contains a polymer (i.e., the block copolymer dispersant) having a relatively low decomposition temperature, which is within the scope of this invention. In Example 5, the transfer coating C contains an additional polymer (i.e., PEO) having a high decomposition temperture (Td ~457° C.), which is not within the scope of the invention and is thus a comparative example.

As indicated in Table 2, donor elements containing transfer layer A (TLA) having only a relatively low decomposition temperature binder ($T_d$=284° C., within the scope of the invention) exhibited significantly higher optical density values (see column labeled "TLA-Ex 4" in Table 2) versus corresponding donor elements containing transfer layer C (TLC) with a high decomposition temperature binder (outside the scope of the invention) (e.g., see column labeled "TLC-Ex 5" in Table 2). Furthermore, the former optical density values (obtained with inventive donor elements having transfer layer A) did not drop significantly with increasing drum rotation speed (rpm) relative to the latter optical density values (obtained with a comparative donor element having transfer layer C). Very significantly, while transferred coatings upon thermal imaging containing transfer layer A did not exhibit durability under conditions of high laser fluence levels (i.e., low drum speeds in the 100–150 rpm range and with sensitivities in the 513–770 $mJ/cm^2$ range), surprisingly and unexpectedly transferred coatings upon thermal imaging containing transfer layer A did exhibit durability under conditions of relatively low laser fluence levels (i.e., relatively high drum speeds in the 200–400 rpm range and with relatively low sensitivities in the 198–440 $mJ/cm^2$ range). In the latter case with use of transfer layer A at low sensitivities, the resulting transferred images were characterized to be both durable and to have unexpectedly high optical density values, which values did not significantly decrease in magnitude with increasing drum rotation speed (relative to those observed with transfer layer C). Both of these factors are highly desirable.

EXAMPLES 6–7

These examples also illustrate the effect of laser fluence on the durability of the transferred mask for four layer donor elements having transfer coating formulations with or without high decomposition temperature polymers (binders).

The four layer donor element used in these examples consisted of the following layers in the sequence listed: a 2 mil PET support layer (DuPont Mylar® 200D), a one micron PVC ejection layer, a heating layer of 80 Å of nickel sputtered onto the ejection layer, and a transfer layer coating that is pigmented and having the specific formulation indicated below (transfer layer A or transfer layer C).

The ejection layer was coated onto a 10 inch width PET support using a continuous coater operated at a line speed of 100 feet/minute. The die was set up using a 4 mil shim, and the drier temperature was 160° F. (71° C.) in all sections. The ejection layer thickness was 2 microns upon coating in each case, which corresponds to a coating weight of 20 mg/dm$^2$. In order to avoid the cracking of ejection layer during sample handling, 9.1% by weight of diphenyl phthalate was added as plasticizer to the formulation. The Tg of coated samples of this PVC formulation was about 55° C. for the PVC layer alone. The solids in the PVC solution were adjusted to viscosities of 300–400 centipoise. The solvent was methyl ethyl ketone (60%) and cyclohexanone (40%). The solutions were filtered in line with a 5 micron filter, and a 1 mil polyethylene cover sheet was laminated to the outer surface of the ejection layer, during coating, in order to protect the ejection layer from scratches and dust prior to sputtering of the metallic heating layer.

The 2-layer support/ejection sample which resulted was then metallized with nickel by Flex, Inc. (Santa Rosa, Calif.) by sputtering Ni to 40% transmission (~80 Å) to form the heating layer. The metal thickness was monitored in situ using a quartz crystal and after decomposition by measuring the reflection and transmutation of the metallized PVC. In each case, the transfer layer was hand coated using a wire rod #5 which resulted in a transfer layer thickness of about 1.1 micron upon drying at ambient temperature. This resulting four layer donor element was then brought in contact with the Cyrel® 67HOS flexographic printing plate to form the laserable assemblage of this example. The laserable assemblage was mounted on the CREO drum in the same manner as given in Examples 1–3.

The densities listed below represent the density of the (pigmented) transfer layer that, upon laser imaging, was transferred onto a flexographic printing plate at the specified drum speed (and therefore, sensitivity). Densities were measured using a McBeth reflection densitometer (McBeth, New Burgh, N.Y.). The following examples illustrate the film sensitivity as a function of the transfer layer formulation.

The densities of the black transfer layer transferred onto the release/barrier layer of the flexographic printing plate upon thermal imaging at the different drum speed are listed in Table 3 for transfer layer A and transfer layer C. The durability of the transferred mask is specified in the last column. (Transfer layer A and transfer layer C were obtained upon coating and drying of transfer coating A and transfer coating C, respectively.)

The black dispersion used contains a carbon black/dispersant. The dispersant used is an A/B type block copolymer of a composition having n-butyl methacrylate (10)/methyl methacrylate (5)//methacrylic acid (10) as comonomers for the A and B blocks, respectively. This block copolymer is hereinafter designated as n-MBMA(10)/MMA(5)//MAA(10). It had been neutralized with potassium hydroxide. It had been prepared by group transfer polymerization (see U.S. Pat. No. 4,417,034).

The composition of the ejection layer coating and of transfer coating A and transfer coating C were as indicated below:

Ejection Layer

| PVC | 1500 grams |
| Diphenyl phthalate | 150 grams |
| Methyl ethyl ketone | 9000 grams |
| Cyclohexanone | 6000 grams |

Transfer Coating A (0% PEO)

14.82 grams of carbon black pigment and a 15.7% n-MBMA(10)/MMA(5)//MAA(10) dispersion in water 0.57 g of potassium hydroxide (KOH)

77.57 grams of water 0.093 grams of Zonyl® FSO surfactant (Du Pont)

Transfer Coating C (30% PEO based on amount of PEO+ transfer coating A)

4.46 grams of 15% PEO (Aldrich) in water 10 grams of transfer coating A, where transfer coating A was made as shown above The weight ratio of carbon black pigment to n-MBMA(10)/MMA(5)//MAA(10) block copolymer used in this example is 2:1. The carbon black pigment was Calvin Black.

The density values and durability data obtained in these examples are presented in Table 3.

TABLE 3

| | | Density | | Durability | |
| --- | --- | --- | --- | --- | --- |
| DS | S | TLA-Ex 6 | TLC-Ex 7 | DA-Ex 6 | DC-Ex 7 |
| 100 | 770 | 3.03 | 2.81 | n | y |
| 125 | 616 | 3.02 | 3.31 | n | y |
| 150 | 513 | 3.15 | 3.11 | n | y |
| 175 | 440 | 3.22 | 2.92 | y | y |
| 200 | 385 | 3.24 | 2.80 | y | y |
| 225 | 342 | 3.12 | 2.47 | y | y |
| 250 | 308 | 3.09 | 2.29 | y | y |
| 275 | 280 | 3.12 | 2.25 | y | y |
| 300 | 257 | 2.93 | 1.90 | y | y |
| 325 | 244 | 2.36 | 1.94 | y | y |
| 350 | 226 | 1.80 | 1.67 | y | y |
| 375 | 211 | 1.64 | 1.33 | y | y |
| 400 | 198 | 1.49 | 0.96 | y | y |

DS = drum rotation speed in revolutions per minute (rpm).
TLA = transfer layer A.
TLC = transfer layer C.
DA = durability of image (photomask) on flexographic printing plate upon laser imaging using donor element having TLA.
DC = durability of image (photomask) on flexographic printing plate upon laser imaging using donor element having TLC.
S = film sensitivity in mJ/cm$^2$
n = material is removed (not durable).
y = no material removed (durable).

For DA and DC, n=not durable and y=durable when durability of transferred image is measured by rubbing a finger over the transferred image and noting by visual observation whether any detectable material is removed (not durable) or not removed (durable), respectively.

In Example 6, the transfer coating A contains a polymer (i.e., the block copolymer dispersant) having a relatively low decomposition temperature, which is within the scope of this invention. In Example 7, the transfer coating C contains an additional polymer (i.e., PEO) having a high decomposition temperature (Td ~457° C.), which is not within the scope of the invention and is thus a comparative example.

As indicated in Table 3, donor elements containing transfer layer A (TLA) having only a relatively low decomposition temperature binder ($T_d$=~284° C., within the scope of the invention) exhibited significantly higher optical density values (see column labeled "TLA-Ex 6" in Table 3) versus corresponding donor elements containing transfer layer C (TLC) with a high decomposition temperature binder (outside the scope of the invention) (e.g., see column labeled "TLC-Ex 7" in Table 3). Furthermore, the former optical density values (obtained with inventive donor elements having transfer layer A) did not drop significantly with increasing drum rotation speed (rpm) relative to the latter optical density values (obtained with a comparative donor element having transfer layer C). Very significantly, while transferred coatings upon thermal imaging containing transfer layer A did not exhibit durability under conditions of high laser fluence levels (i.e., low drum speeds in the 100–150 rpm range and with sensitivities in the 513–770 mJ/cm$^2$ range), surprisingly and unexpectedly transferred coatings upon thermal imaging containing transfer layer A did exhibit durability under conditions of relatively low laser fluence levels (i.e., relatively high drum speeds in the 200–400 rpm range and with relatively low sensitivities in the 198–440 mJ/cm$^2$ range). In the latter case with use of transfer layer A at low sensitivities, the resulting transferred images were characterized to be both durable and to have unexpectedly high optical density values, which values did not significantly decrease in magnitude with increasing drum rotation speed (relative to those observed with transfer layer C). Both of these factors are highly desirable. Description of experimental setup for the method for making a color filter element The digital images in the following examples were obtained by transferring a pigmented layer of choice from a donor element onto a receiver element and, in turn, laminating the image from the receiver element onto glass, a polarizer or other suitable substrate for color filter applications. More generally, the image on the receiver element can be transferred to any substrate that can be used as a component in the fabrication of the face plate of the display.

A laserable assemblage, consisting of a donor element and a receiver element (to be described) was written by focusing an infrared beam onto a heating layer sandwiched between the ejection layer and the transfer layer (which is pigmented) of the donor element. The heat from the heating layer decomposes the ejection layer creating a gas bubble that propels the pigmented transfer layer onto the receiver element.

The images described in the following examples were obtained by using a CREO 3244 Trendsetter exposure unit (Creo Inc. Vancouver, Canada). The system comprises an 81.2-cm long drum and an 91-cm in perimeter. The donor element and receiver element were automatically loaded by mounting them onto a lithographic Aluminum plate, which was then inserted from the top. Upon loading, the Aluminum plate was automatically clamped at the leading edge and magnetically held at the trailing edge. Both the receiver element and the donor element were taped onto the Aluminum plate prior to its automatic loading. The receiver element was first taped onto the Aluminum plate 5 cm away from its leading and right edges and the donor element tightly placed on top, with the emulsion towards the receiver element. The donor element was taped at leading and trailing edges. The plate, with donor and receiver elements, was then auto loaded onto the drum. The donor element was exposed with an array of overlapping 240 5×2 micron spots that result from the splitting through a light valve of a 20 watt infrared diode lasers beam emitting at 830 nm at 5 microseconds pulse width. The drum speed was varied from 60 to 170 RPM to achieve sensitivities in the 125 to 550 mJ/cm$^2$ range.

In the following examples, the donor element included 4 layers: (1) a MYLAR® polyester support, (2) a 1 micron polyvinyl chloride (PVC) ejection layer coated directly on top of (1), (3) a heating layer of a thin metal layer sputtered on the ejection layer (2), and (4) a transfer layer of a 1 micron pigmented layer of the formulation listed in each specific example, gravure coated onto the sputtered metal layer (3).

GLOSSARY

BA: Butyl acrylate

BMA: n-butyl methacrylate

Byk 345: Polyether modified siloxane, (a surfactant and defoamer from Byk Chemie)

Castle Cyan: Cyan concentrate of water, potassium hydroxide, di-ethylene glycol, and cyan pigment. (from DuPont, Wilmington, Del.)

Castle Magenta: Magenta pigment dispersion in water, 27.1% solids, (from DuPont)

Castle Yellow: Yellow pigment dispersion in water, (29.7% solids) (from DuPont)

Flexiverse blue: Blue pigment/dispersant in water (from Sun Chemicals)

Flexiverse red: Red pigment/dispersant in water (from Sun Chemicals)

Flexiverse green: Green pigment/dispersant in water (from Sun Chemicals)

HEA: Hexaethyl acrylate

HEMA: Hexaethyl methacrylate

Hobbes: Black concentrate pigment (from DuPont)

IR 125: Infrared dye (from Kodak)

MAA: Methacrylic acid

MMA: Methylmethacrylate

MW: molecular weight

MYLAR®: Polyethylene terephthalate

PEG: Polyethylene glycol (from Scientific Polymer Products)

RCP 11050: Skyline resin, acrylic polymer in water (from DuPont)

RCP 26735: Skyline resin, acrylic polymer in water (from DuPont)

RPM: Revolution per minute

EXAMPLES 8–11

The formulations in the following examples illustrate 4-layer donor samples transferred onto a variety of receiver elements.

For the donor element, the 1 micron PVC (Aldrich, MW:78,000) ejection layer was reverse-gravure coated onto 142D MYLAR® polyester (54 inch wide), at a line speed of 100 FPM. The thickness of the ejection layer was about 1 micron ($10^{-4}$ cm) which corresponds to coating weight of 15 milligrams/dm$^2$. In order to avoid cracking of the ejection layer during film handling, 10% by weight di-phenyl phalate was added to the formulation. The solids in the PVC solution were adjusted to 11.5% leading to a viscosity of about 300 centipoisse. The solvent comprised Methyl Ethyl Ketone (MEK) 80% and Cyclohexanone (Cy) 20%. The latter was used to aid in the dilution and slow the film drying. The solutions were filtered in-line using a 10-micron filter. After coating of the ejection layer was completed, the film (i.e., support with ejection layer) was submitted to Vacuum Deposit Inc. (Louisville, Ky.) for sputtering of the metal heating layer of Chromium to 40% transmission. The thickness of the metal heating layer was monitored in-situ using a quartz crystal, and after deposition, by measuring reflection and transmission of the film (i.e., support, ejection layer, and heating layer). The pigmented transfer layer of the formulation specified below were handcoated using a wire rod #4 and #7 leading to films with thicknesses ranging between 0.5 and 1.2 micron, respectively.

Transfer layer composition:

| Blue Dispersion | Grams |
|---|---|
| Castle Cyan (29.6% solids) | 34.22 |
| RCP 26735 (37.4% solids) | 3.2 |
| PEG (MW = 6800) (30% solids in water) | 1.0 |
| PEG (MW = 300) | 0.3 |
| IR144 | 0.625 |
| Byk 345 | 0.4 |
| Water | 266.66 |
| Total solution | 400.05 |
| Total solids | 100 |

The total percent by weight of PEG based on the total weight of the transfer layer was 2.3%

The receiver elements used in this example were: a 1 mil thick polyethylene sheet (referred to as PE), WATER-PROOF® transfer sheet (referred to as WPTS), and a capture transfer sheet (referred to as CRTS). The WPTS was comprised of a 4 mils (100 microns) layer of ELVAX® an ethylene-vinylacetate copolymer between a 5 mil polyester base and a coversheet. The CRTS had the following structure in order: an adhesive layer (1–2 microns thick); a release layer (~10 microns thick); an optional cushion layer (50–600 microns thick); and base (polyester support). In the examples, the CRTS can be one of the following compositions:

| CRTS | Adhesive Layer | Release Layer | Cushion Layer | Base |
|---|---|---|---|---|
| CRTS-1 | Elvacite 2044 n-butyl-methacrylate | Ultramid 1C polyamide 6/6.6/6.13 | Kraton FX1901X styrene/ethylene/butylene/styrene block copolymer | MYLAR® 500D |
| CRTS-2 | Elvacite 2046 n-butyl/i-butyl methacrylate | Unirez 2654 polyamide (a condensate of fatty acids and polyamines) | — | MYLAR® 500D |

TABLE 4a

| | Example 8 | Example 9 | Example 10 | Example 11 |
|---|---|---|---|---|
| Receiver element | CRTS-1 | WPTS | PE | CRTS-2 |

The densities listed below represent the density of the pigment transfered onto a receiver element at the specified drum speed (and therefore, sensitivity). Densities were measured in transmission using a McBeth reflection densitometer (Newburgh, N.Y.). The following examples illustrate the film sensitivity as a function of the support.

TABLE 4b

| Drum Speed (RPM) | Film Sensitivity (mJ/cm$^2$) | Density Example 8 | Density Example 9 | Density Example 10 | Density Example 11 |
|---|---|---|---|---|---|
| 38.1 | 550 | 0.72 | 0.97 | 0.77 | 1.09 |
| 41.9 | 500 | 1.21 | 1.47 | 1.01 | 1.35 |
| 46.5 | 450 | 1.19 | 1.39 | 1.49 | 1.29 |
| 52.4 | 400 | 1.23 | 1.46 | 1.65 | 1.47 |
| 59.8 | 350 | 1.49 | 1.66 | 1.75 | 1.46 |
| 69.8 | 300 | 1.62 | 1.65 | 1.38 | 0.52 |
| 76.2 | 275 | 1.33 | 1.39 | 0.93 | 0.2 |
| 83.8 | 250 | 0.2 | 0.51 | 0.1 | 0.06 |
| 93.1 | 225 | 0.02 | 0.12 | 0.01 | |

The images on the receiver element were laminated onto glass at 110° C. using a RISTON® laminator at a speed of 0.5 m/min. The structure of the CRTS (i.e., the receiver element) was designed for a clean fracture at the interface between the adhesive layer and the release layer upon removal of the support after lamination to a permanent support. For color filter applications, the adhesive layer of the CRTS (i.e., the image-receiving layer) acts as a planarizing layer for a LCD. The adhesive layer remains on top of the color layer after the pigmented layer was transferred to glass.

In the example in which the receiver element was WPTS, upon transfer of the image to glass, the image-receiving layer (i.e.,ELVAX® layer) fractured at or very close to the interface of the pigmented layer and the image-receiving layer, such that the image-receiving layer transferred with the pigmented (color filter) layer. The image-receiving layer was then positioned away from the glass and on top of the pigment and to act as a planarizing layer.

EXAMPLES 12–16

The formulations in the following examples illustrate the durability of the transferred image as a function of the thickness of the pigmented transfer layer of the donor element.

For the donor elements, the pigmented transfer was hand-coated to different thicknesses using Meyer rods. The PVC ejection layer was reverse gravure coated onto 142D MYLAR® polyester (54 inch wide) at a line speed of 100 FPM. The film thickness was about 1 micron ($10^{-4}$ cm) which corresponds to coating weight of about 100 milligram/dm$^2$. In order to avoid cracking of the ejection layer during film handling, 10% by weight di-phenyl phalate was added to the formnulation. The solids in the PVC (Aldrich, MW 78,000) solution were adjusted to 11.5% leading to a viscosity of about 300 centipoise. The solvent comprised methyl ethyl ketone (MEK) 80% and cyclohexanone 20%. The latter was used to slow the film drying eliminating areas of cloudiness previously observed and to aid in the dilution of PVC in MEK. The solutions were filtered in-line using a 10-micron filter. After the coating of the ejection layer was completed, the film (i.e., support and ejection layer) was submitted to Vacuum Deposit Inc. (Louisville, Ky.) for sputtering of the metal heating layer of Chromium to 40% transmission. The thickness of the metal heating layer was monitored in-situ using a quartz crystal, and after deposition, by measuring reflection and transmission of the film (i.e., support, ejection layer and heating layer). The pigmented transfer layer of the formulations specified below was handcoated using a wire rod #5, #6, and #7 leading to thicknesses of 0.6 microns (for Rod #5), 0.8 micron (for Rod #6) and 1.1 micron (for Rod #7).

The receiver element for Examples 12–16 was a WATER-PROOF® transfer sheet (WPTS).

The densities listed below represent the density of the pigment transferred onto a receiver element at the specified drum speed (and therefore, sensitivity). Densities were measured using a McBeth reflection densitometer (Newburgh, N.Y.). The following examples illustrate the film sensitivity, optical density and durability as a function of the thickness of the pigmented layer. Transfer layer composition:

| Black composition | (grams) | % solids |
|---|---|---|
| Hobbes(29.6% solids) | 48.22 | 77.5% |
| RCP26735 (37.4% solids) | 3.74 | 10% |
| PEG (MW = 6800) (30% solids) | 2.33 | 5% |
| PEG (MW = 300) | 0.7 | 5% |
| Adhesive* | 0.88 | 2.5% |
| Byk 345 | 1.0 | |
| Water | 43.13 | |
| Total solution | 100.00 | |
| Total solids | | 15% |

*The adhesive was DR08298 provided by Dunmore (Newtown, PA).

The total percent by weight of PEG based on the total weight of the transfer layer was 4.6%.

TABLE 5

| Drum Speed (RPM) | Film Sensitivity (mJ/cm$^2$) | Density Example 12 | Example 13 | Example 14 | Example 15 | Example 16 |
|---|---|---|---|---|---|---|
| 38.1 | 550 | 0.82N | 0.97N | 1.6N | 0.86N | 1.09N |
| 41.9 | 500 | 1.11N | 1.47N | 1.18N | 0.93N | 1.35N |
| 46.5 | 450 | 1.23N | 1.32N | 1.5N | 0.99N | 1.29N |
| 52.4 | 400 | 1.23N | 1.51Y | 1.7Y | 1.07N | 1.67Y |
| 59.8 | 350 | 1.68Y | 1.69Y | 1.68Y | 1.1N | 1.64Y |
| 69.8 | 300 | 1.74Y | 1.77Y | 1.86Y | 1.3Y | 1.7Y |
| 76.2 | 275 | 1.67Y | 1.83Y | 1.9Y | 1.66Y | 1.73Y |
| 83.8 | 250 | 1.74Y | 1.86Y | 1.96Y | 1.80Y | 1.76Y |
| 93.1 | 225 | 1.82Y | 1.95Y | 2.1Y | 1.96Y | 1.65Y | wherein
"N" indicates that the transferred image is not durable
"Y" indicates that the transferred image is durable

EXAMPLES 17–20

The following examples illustrate suitable red formulations for color filter applications. The appropriate color was obtained by using either red pigment/dispersions or by mixing magenta and yellow dispersions at the appropriate ratios. In Example 17, methyl orange not only shifts the spectral response of the magenta dispersion into the red but increases the film sensitivity as well. In Example 18, the appropriate red shade was achieved by mixing magenta and yellow dispersions. As in the previous examples, the pigmented transfer layer of the donor element was transferred onto a receiver element using a CREO Trendsetter. For these examples the receiver was either WATERPROOF® transfer sheet (WPTS) or a polarizer element with the structure used for thin film transistor (TFT) color filters. The structure of the polarizer element was in order, a base support of polyethylene terephthalate; a layer of triacetylcellulose (TAC); a layer of polyvinylalcohol (PVA); a second layer of TAC, and a coversheet of polyethylene terephthalate. The images transferred onto the WPTS receiver element were afterwards laminated onto glass coated with 1 micron film of an ethylene co-polymer (HP771, sold by DuPont).

Transfer layer composition:

| | Example 17 grams (% solids) | Example 18 grams (% solids) |
|---|---|---|
| Flexiverse red | 23.23 (75%) | 23.23 (75%) |
| RCP11050 | 3.92 (10%) | 3.92 (10%) |
| PEG (MW = 6800) | 3.26 (7%) | 2.8 (6%) |
| PEG (MW = 300) | 0.84 (6%) | 0.63 (4.5%) |
| IR 125 | 0.28 (2%) | 0.28 (2%) |
| Diazo N,N diethylaniline fluoroborate | — | 0.35 (2.5%) |
| Byk 345 | 1.00 | 1.00 |
| Water | 67.47 | 67.79 |

The total percent by weight of PEG based on the total weight of the transfer layer was 2.66% for Example 17 and 2% for Example 18.

| | Example 19 grams (% solids) | Example 20 grams (% solids) |
|---|---|---|
| Castle Magenta | 36.16 (70%) | 22.6 (43.75%) |
| Castle Yellow | — | 13.56 (26.25%) |
| Dispersant* | 8.48 (20%) | 8.48 (20%) |
| IR 125 | 0.28 (2%) | 0.28 (2%) |
| Ethyl orange sodium salt | 1.12 (8%) | — |
| Byk 345 | 1.0 | 1.0 |
| Water | 52.96 | 52.69 |

*The dispersant was HEMA/MAA/MMA/BMA in portions of 10%/2%/8%/80% by weight, based upon the weight of the dispersant.

The color layer transferred well and had acceptable uniformity and optical density on the glass substrate.

EXAMPLES 21–24

This example illustrates blue formulations for color filter applications. The appropriate color was obtained by using a blue pigment/dispersions. As in the previous examples, the pigmented transfer layer was transferred onto a receiver element using a CREO Trendsetter. For these examples, the receiver element was either a WPTS or a polarizer with the structure used for TFT color filters as described in the previous examples. The images transferred onto WPTS were afterwards laminated onto glass coated with ethylene co-polymer (HP771).

Transfer Layer Composition:

| | Example 21 gram (% solid) | Example 22 gram (% solid) | Example 23 gram | Example 24 gram |
|---|---|---|---|---|
| Flexiverse blue | 22.63 (75%) | 22.63 (75%) | 22.63 | 22.63 |
| RCP 11050 | 3.92 (10%) | 3.92 (10%) | 3.92 | 3.92 |
| PEG (MW = 6800) | 2.80 (6%) | 2.8 (6%) | 3.26 | 2.8 |
| PEG (MW = 300) | 0.63 (4.5%) | 0.77 (5.5%) | 0.84 | 0.63 |
| IR 125 | 0.28 (2%) | 0.14 (1%) | 0.28 | 0.28 |
| Adhesive* | 0.35 (2.5%) | 0.35 (2.5%) | — | — |
| Diazo- N,N diethylaniline fluoroborate | — | — | 0.35 | 0.35 |

-continued

|  | Example 21 gram (% solid) | Example 22 gram (% solid) | Example 23 gram | Example 24 gram |
|---|---|---|---|---|
| Byk 345 | 1.0 | 1.0 | 1.0 | 1.0 |
| Water | 67.86 | 67.86 | *67.86 | *67.86 |

*The adhesive was ER08298 provided by Dunmore (Newtown, PA).
The color layer had acceptable uniformity and optical density on the glass support.

EXAMPLES 25–30

The following examples illustrate blue formulations for color filter applications. The appropriate color was obtained by mixing magenta and cyan dispersions. As in the previous examples, the pigmented transfer layer was transferred onto a receiver element using a CREO Trendsetter. For these examples the receiver was either WPTS or a polarizer element with the structure used for TFT color filters as described above. The images transferred onto WPTS receiver element were afterwards laminated onto coated glass.

Transfer Layer Composition:

|  | Exam. 25 grams | Exam. 26 grams | Exam. 27 grams | Exam. 28 grams | Exam. 29 grams | Exam. 30 grams |
|---|---|---|---|---|---|---|
| Castle Cyan | 31.36 | 30.36 | 29.366 | 30.96 | 29.96 | 28.96 |
| Castle Magenta | 6.27 | 6.073 | 5.87 | 6.19 | 5.99 | 5.79 |
| RCP 26735 | 4.49 | 4.49 | 4.49 | 4.49 | 4.49 | 4.49 |
| PEG (MW = 6800) | 1.4 | 1.4 | 1.4 | 1.4 | 1.4 | 1.4 |
| PEG (MW = 300) | 0.42 | 0.77 | 1.12 | 0.42 | 0.77 | 1.12 |
| IR 125 | 0.14 | 0.14 | 0.14 | 0.14 | 0.14 | 0.14 |
| Adhesive* | 0.88 | 0.88 | 0.88 | 0.88 | 0.88 | 0.88 |
| Byk 345 | 1.0 | 1.0 | 1.0 | 1.0 | 1.0 | 1.0 |
| Water | 54.03 | 54.88 | 55.73 | 54.37 | 55.22 | 56.07 |

*The adhesive was provided by Dunmore (Newtown, PA).

The total percent by weight of PEG based on the total weight of the transfer layer was 2.8% for Example 25, 5.1% for Example 26, 7.4% for Example 27, 2.8% for Example 28, 5.1% for Example 29, and 7.4% for Example 30.

The color layer transferred and had acceptable uniformity and optical density onto the glass substrate.

EXAMPLES 31–33

The following examples illustrate green formulations for color filter applications. The green films were achieved either by mixing yellow and cyan dispersions or with dispersions of green pigment. As in the previous examples, the pigmented transfer layer was transferred onto a receiver element using a CREO Trendsetter. For these examples the receiver element was either a WPTS or a polarizer element with the structure used for TFT color filters as described above. The images transferred onto WPTS were afterwards laminated onto coated glass.

|  | Example 31 grams (% solids) | Example 32 grams (% solids) | Example 33 grams (% solids) |
|---|---|---|---|
| Castle Cyan | 12.33 (26.16%) | 12.17 (25.83%) | — |
| Castle Yellow | 24.66 (52.33%) | 24.35 (51.66%) | — |
| Flexiverse Green | — | — | 21.52 (77%) |
| RCP 26735 | 4.49 (12%) | 4.49 (12%) | 3.74 (10%) |
| PEG (MW = 6800) | 1.4 (3%) | 1.4 (3%) | 2.8 (6%) |
| PEG (MW = 300) | 0.42 (3%) | 0.42 (3%) | 0.63 (4.5%) |
| IR 125 | 0.14 (1%) | 0.28 (2%) | — |
| Adhesive* | 0.88 (2.5%) | 0.88 (2.5%) | 0.88 (2.5%) |
| Byk 345 | 1.00 | 1.00 | 1.00 |
| Water | 54.67 | 55 | 69.43 |

*The adhesive was provided by Dunmore (Newtown, PA).

The color layer transferred and had acceptable uniformity and optical density on the glass substrate.

EXAMPLE 34–40

The black formulations in the following examples comprise 4-layer sample handcoated with latices of different compositions using Meyer rods and transferred onto a WPTS. The latter are laminated onto glass to be used as masks for color filter applications.

For the donor element, the PVC ejection layer was reverse gravure coated onto a support of MYLAR® 142D at a line speed of 100 FPM. The film thickness was about 1 micron ($10^{-4}$ cm) which corresponds to coating weights of 100 milligrams/dm$^2$. In order to avoid cracking of the ejection layer during handling 10% by weight di-phenyl phalate was added to the formulation. The solids in the PVC (Aldrich, MW=78,000) solution were adjusted to 11.5% leading to a viscosity of about 300 centipoise. The solvent comprised methyl ethyl ketone (MEK) 80% and cyclohexanone 20%. The latter was used to slow the film drying eliminating areas of cloudiness previously observed and to aid in the dilution of PVC in MEK. The solutions were filtered in-line using a 10 micron filter. After the coating of the ejection layer was completed, the film (i.e., support and ejection layer) was submitted to Vacuum Deposit Inc. (Louisville, Ky.) for sputtering of the metal heating layer of Chromium to 40% transmissions. The thickness of the metal layer was monitored in-situ using a quartz crystal and after deposition by measuring reflection and transmission of the film, (i.e., support, ejection layer, and heating layer). The pigmented donor layer of the formulation specified below were handcoated using a wire Meyer rod #5 leading to thicknesses of about 0.6 microns. The densities listed below represent the density of the pigment transferred onto a transfer sheet at the specified drum speed (and therefore, sensitivity). Densities were measured using a McBeth reflection densitometer (Newburgh, N.Y.).

The following examples illustrate the film sensitivity, optical density and durability. As seen in the examples the durability of the layers is roughly linear to the thickness of the transfer layer with a 0.5 micron black layer being durable when exposed below 250 mJ/cm$^2$ while a 1.0 micron layer being durable when exposed below 400 mJ/cm$^2$. The black control layer was produced using RCP 26735 which was used in previous examples. The composition of the latex used for each Example is listed below:

| Sample | Latex Composition |
| --- | --- |
| Control: | RCP26735 and 20% MMA/80% BMA |
| Example 34: | 10% MMA/40% BMA/40% BA/10% HEA |
| Example 35: | 18% MMA/12% BMA/60% BA/10% HEA |
| Example 36: | 40% MMA/40% BMA/10% BA/10% HEA |
| Example 37: | 40% MMA/40% BMA/10% BA/10% MAA |
| Example 38: | 20% MMA/15% BMA/60% BA/5% MAA |
| Example 39: | 15% MMA/40% BMA/40% BA/5% MAA |
| Example 40: | 95% MMA/5% BMA |

| Black transfer layer composition: | grams | % solids |
| --- | --- | --- |
| Hobbes (29.6% solids) | 48.22 | 77.5% |
| Latex (as listed above) | 3.74 | 10% |
| PEG (MW = 6800) (30% solids) | 3.03 | 6.5% |
| PEG (MW = 300) | 0.84 | 6% |
| Byk 345 | | 1.0 |
| Water | | 43.17 |
| Total solution | 100.00 | |

The total percent by weight of PEG based on the total weight of the transfer layer was 5.6%.

TABLE 6

| Drum Speed (RPM) | Film Sensitivity (mJ/cm$^2$) | Density | | | | | | |
| --- | --- | --- | --- | --- | --- | --- | --- | --- |
| | | Exam. 34 | Exam. 35 | Exam. 36 | Exam. 37 | Exam. 38 | Exam. 39 | Exam. 40 |
| 59.8 | 350 | 0.63 | 0.44 | 0.81 | 0.57 | 0.44 | 0.7 | 0.6 |
| 69.8 | 300 | 0.93 | 1.07 | 0.71 | 0.56 | 0.52 | 0.92 | 0.65 |
| 76.2 | 275 | 0.98 | 1.57 | 1.66 | 1.82 | 0.95 | 1.54 | 2.07 |
| 83.8 | 250 | 2.41 | 2.16 | 1.79 | 1.84 | 1.27 | 3.06 | 2.78 |
| 93.1 | 225 | 2.66 | 2.25 | 2.39 | 2.46 | 2.59 | 2.79 | 3.29 |
| 104.7 | 200 | 2.63 | 1.16 | 2.95 | 2.79 | 3.18 | 3.6 | 3.27 |
| 119.7 | 175 | 2.58 | 2.08 | 3.03 | 3.16 | 2.74 | 3.43 | 3.12 |
| 139.6 | 150 | 2.35 | 2.09 | 3.01 | 3.30 | 2.69 | 3 | 2.94 |
| 167.6 | 125 | 2.27 | 2.08 | 2.54 | 3.2 | 2.56 | 3.5 | 2.91 |

The examples above show that for film thicknesses of the black layer in the 0.5 micron range the transfer black is durable if transferred at energies below 225 to 250 mJ/cm$^2$. These were all durable films.

The color layer transferred with acceptable uniformity and optical density onto the glass substrate.

What is claimed is:

1. A method for making a color filter element comprising:
   (1) an exposure step of imagewise exposing to laser radiation a laserable assemblage comprising:
      (A) a donor element comprising in the order listed:
         (a) at least one ejection layer;
         (b) at least one heating layer;
         (c) at least one transfer layer having an outer surface and comprising a low decomposition temperature polymer having a decomposition temperature less than about 350° C.;
            with the proviso that the donor element during the transfer process does not include a support; and
      (B) a receiver element in contact with the outer surface of the transfer layer (c) of the donor element;
         wherein the exposure step is effected at a laser fluence of at most approximately 440 mJ/cm$^2$; and
   (2) a separating step of separating the donor element (A) from the receiver element (B).

2. The method of claim 1 wherein the receiver element is selected from a glass substrate, a polarizing substrate, a receiver support, and an intermediate receiver element.

3. The method of claim 2 wherein the intermediate receiver element comprises:
   (a) an image receiving layer; and
   (b) a receiver support.

4. A method for making a color filter element comprising:
   (1) an exposure step of imagewise exposing to laser radiation a laserable assemblage comprising:
      (A) a donor element comprising in the order listed:
         (a) at least one ejection layer;
         (b) at least one heating layer;
         (c) at least one transfer layer having an outer surface and comprising a low decomposition temperature polymer having a decomposition temperature less than about 350° C.;
            with the proviso that the donor element during the transfer process does not include a support; and
      (B) an intermediate receiver element in contact with the outer surface of the transfer layer (c) of the donor element, the intermediate receiver element comprising
         (a) an image receiving layer; and
         (b) an intermediate support;
            wherein the exposure step is effected at a laser fluence of at most approximately 440 mJ/cm$^2$ whereby a substantial portion of the transfer layer is transferred to the intermediate receiver element; and
   (2) a separating step of separating the donor element (A) from the intermediate receiver element (B), thereby revealing an image on the intermediate receiver element.

5. The method of claim 4 wherein the transfer layer comprises a colorant to form the image in a first color, the method further comprising:
   (3) an exposing step of imagewise exposing to laser radiation a laserable assemblage comprising in the order listed:
      (A) a second donor element comprising
         (a) at least one ejection layer;
         (b) at least one heating layer;
         (c) at least one transfer layer having an outer surface and comprising a low decomposition temperature polymer having a decomposition temperature less than about 350° C. and a colorant different than the previous colorant, with the proviso that the donor element during the transfer process does not include a support; and
      (B) the intermediate receiver element formed in step 2 having the image of the first color in contact with the outer surface of the transfer layer (c) of the donor element;

wherein the exposure step is effected at a laser fluence of at most approximately 440 mJ/cm$^2$ whereby a substantial portion of the transfer layer is transferred to the intermediate receiver element;

(4) a separating step of separating the second donor element from the intermediate receiver element.

6. The method of claim 5 further comprising:

(5) an exposure step of imagewise exposing to laser radiation a laserable assemblage comprising:
   (A) a third donor element comprising in the order listed:
      (a) at least one ejection layer;
      (b) at least one heating layer;
      (c) at least one transfer layer having an outer surface and comprising a low decomposition temperature polymer having a decomposition temperature less than about 350° C. and a colorant different than the previous colorants, with the proviso that the donor element during the transfer process does not include a support; and
   (B) the intermediate receiver element formed in step 5 having the image of the previous colors in contact with the outer surface of the transfer layer (c) of the donor element;

(6) a separating step of separating the third donor element from the intermediate receiver element.

7. The method of claim 6 further comprising:

(7) an exposure step of imagewise exposing to laser radiation a laserable assemblage comprising:
   (A) a fourth donor element comprising in the order listed:
      (a) at least one ejection layer;
      (b) at least one heating layer;
      (c) at least one transfer layer having an outer surface and comprising a low decomposition temperature polymer having a decomposition temperature less than about 350° C. and a colorant different than the previous colorants, with the proviso that the donor element during the transfer process does not include a support; and
   (B) the intermediate receiver element formed in step (7) having the image of the previous colors in contact with the outer surface of the transfer layer (c) of the donor element;

(8) a separating step of separating the fourth donor element from the intermediate receiver element.

8. The method of claim 3 or claim 7 further comprising:
a transferring step of transferring the image from the intermediate receiver element to a receptor element.

9. A method for making a color filter element comprising:
(1) an exposure step of imagewise exposing to laser radiation a laserable assemblage comprising:
   (A) a donor element comprising in the order listed:
      (a) at least one ejection layer;
      (b) at least one heating layer;
      (c) at least one transfer layer having an outer surface and comprising at least 3% by weight of a high decomposition temperature polymer having a decomposition temperature greater than about 395° C. in the presence of a dispersant which is a low decomposition temperature polymer having a decomposition temperature less than about 350° C.;
      with the proviso that the donor element during the transfer process does not include a support; and
   (B) a receiver element in contact with the outer surface of the transfer layer (c) of the donor element;
   wherein the exposure step is effected at a laser fluence of at greater than 440 mJ/cm$^2$; and (2) a separating step of separating the donor element (A) from the receiver element (B).

10. The method of claim 9 wherein the receiver element is selected from a glass substrate, a polarizing substrate, a receiver support, and an intermediate receiver element.

11. The method of claim 10 wherein the intermediate receiver element comprises:
   (a) an image receiving layer; and
   (b) a receiver support.

12. The method of claim 11 wherein the transfer layer comprises a colorant to form the image in a first color, the method further comprising:

(3) an exposing step of imagewise exposing to laser radiation a laserable assemblage comprising in the order listed:
   (A) a second donor element comprising
      (a) at least one ejection layer;
      (b) at least one heating layer;
      (c) at least one transfer layer having an outer surface and comprising at least 3% by weight of a high decomposition temperature polymer having a decomposition temperature greater than about 395° C. in the presence of a dispersant which is a low decomposition temperature polymer having a decomposition temperature less than about 350° C. and a colorant different than the previous colorant, with the proviso that the donor element during the transfer process does not include a support; and
   (B) the intermediate receiver element formed in step 2 having the image of the first color in contact with the outer surface of the transfer layer (c) of the donor element;
   wherein the exposure step is effected at a laser fluence of greater than 440 mJ/cm$^2$ whereby a substantial portion of the transfer layer is transferred to the intermediate receiver element;

(4) a separating step of separating the second donor element from the intermediate receiver element.

13. The method of claim 12 further comprising:

(5) an exposure step of imagewise exposing to laser radiation a laserable assemblage comprising:
   (A) a third donor element comprising in the order listed:
      (a) at least one ejection layer;
      (b) at least one heating layer;
      (c) at least one transfer layer having an outer surface and comprising at least 3% by weight of a high decomposition temperature polymer having a decomposition temperature greater than about 395° C. in the presence of a dispersant which is a low decomposition temperature polymer having a decomposition temperature less than about 350° C. and a colorant different than the previous colorants, with the proviso that the donor element during the transfer process does not include a support; and
   (B) the intermediate receiver element formed in step 5 having the image of the previous colors in contact with the outer surface of the transfer layer (c) of the donor element;

(6) a separating step of separating the third donor element from the intermediate receiver element.

14. The method of claim 13 further comprising:

(7) an exposure step of imagewise exposing to laser radiation a laserable assemblage comprising:
   (A) a fourth donor element comprising in the order listed:
      (a) at least one ejection layer;
      (b) at least one heating layer;
      (c) at least one transfer layer having an outer surface and comprising at least 3% by weight of a high decomposition temperature polymer having a decomposition temperature greater than about 395° C. in the presence of a dispersant which is a low decomposition temperature polymer having a decomposition temperature less than about 350° C. and a colorant different than the previous colorants, with the proviso that the donor element during the transfer process does not include a support; and
   (B) the intermediate receiver element formed in step (7) having the image of the previous colors in contact with the outer surface of the transfer layer (c) of the donor element;
(8) a separating step of separating the fourth donor element from the intermediate receiver element.

15. The method of claim 12 or claim 14 further comprising:
   a transferring step of transferring the image from the intermediate receiver element to a receptor element.

16. The method of claim 9 wherein the high decomposition temperature polymer is present in an amount of between 3 to 15% by weight in the at least one transfer layer.

17. The method of claim 3 or claim 11 wherein the intermediate receiver element further comprises at least one additional layer between the image receiving layer and the receiver support wherein the additional layer is selected from the release layer and the cushion layer.

* * * * *